(12) United States Patent
Endo et al.

(10) Patent No.: US 7,131,478 B2
(45) Date of Patent: Nov. 7, 2006

(54) COMPONENT SUPPLY SYSTEM

(75) Inventors: Shinichiro Endo, Yamanashi (JP);
Takashi Andoh, Yamanashi (JP);
Hiroyuki Fujiwara, Yamanashi (JP);
Yuuji Nagasawa, Yamanashi (JP);
Hironori Konno, Kanagawa (JP);
Hiroaki Imagawa, Yamanashi (JP);
Wataru Hirai, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/037,221

(22) Filed: Jan. 19, 2005

(65) Prior Publication Data
US 2005/0121140 A1 Jun. 9, 2005

Related U.S. Application Data

(62) Division of application No. 10/312,404, filed as application No. PCT/JP01/05669 on Jun. 29, 2001, now Pat. No. 6,910,514.

(30) Foreign Application Priority Data

Jun. 30, 2000 (JP) ............................. 2000-198016
Jul. 28, 2000 (JP) ............................. 2000-228877
Dec. 11, 2000 (JP) ............................. 2000-375832

(51) Int. Cl.
*B65H 5/28* (2006.01)
(52) U.S. Cl. ................... 156/584; 156/344; 221/25; 221/72; 221/87; 414/411; 414/416.03; 414/416.05
(58) Field of Classification Search .............. 221/25, 221/72, 73, 79, 87; 156/344, 584; 226/120, 226/139; 414/411, 416, 425, 416.01, 416.03, 414/416.05, 416.08
See application file for complete search history.

(56) References Cited

U.S. PATENT DOCUMENTS

| | | | | |
|---|---|---|---|---|
| 5,342,474 A | * | 8/1994 | Mohara et al. | 156/584 |
| 5,531,859 A | * | 7/1996 | Lee et al. | 156/584 |
| 6,026,885 A | * | 2/2000 | Mogi et al. | 156/584 |
| 6,082,428 A | * | 7/2000 | Ando et al. | 156/584 |
| 6,202,890 B1 | * | 3/2001 | Morita et al. | 221/87 |

(Continued)

FOREIGN PATENT DOCUMENTS

CN 1244334 A 2/2000

(Continued)

OTHER PUBLICATIONS

English Machine Translation of Japanese Patent Publication 11-040985.*

*Primary Examiner*—Mark A. Osele
(74) *Attorney, Agent, or Firm*—Wenderoth, Lind & Ponack, L.L.P.

(57) ABSTRACT

An apparatus for supplying a component carrier in the form of a tape is provided. The component carrier has a number of cavities formed on one surface thereof for containing components. A pair of spaced first and second guide plates that function to guide one surface of the component carrier. A movable guide plate is disposed between the first and second guide plates so that it can move back and forth between a first position adjacent to the first guide plate for defining a component pickup station and a second position adjacent to the second guide plate. The movable guide plate has an extension which extends along at least one longitudinal edge of the component carrier and opposes the one surface of the component carrier for preventing movement thereof when the movable guide plate takes the first position.

6 Claims, 20 Drawing Sheets

U.S. PATENT DOCUMENTS 6,513,563 B1 2/2003 Ando et al.
2004/0188024 A1* 9/2004 Hwang et al. ............. 156/361

FOREIGN PATENT DOCUMENTS

| JP | 03/217090 | 9/1991 |
| JP | 05-304391 | 11/1993 |
| JP | 05-335785 | 12/1993 |
| JP | 07-038286 | 2/1995 |
| JP | 11-040985 | 2/1999 |
| JP | 11-266098 | * 9/1999 |

* cited by examiner

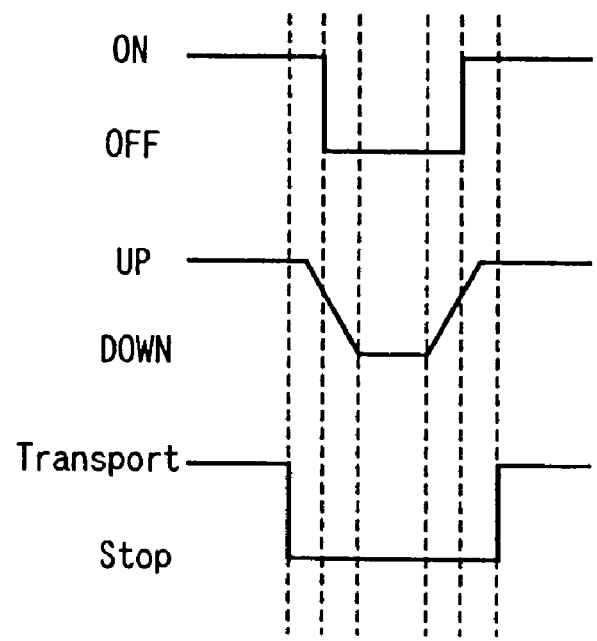
Fig.4A  Electromagnet
Fig.4B  Movement of the quill
Fig.4C  Transporting component

*Prior Art*

*Prior Art*

Prior Art

Prior Art

COMPONENT SUPPLY SYSTEM

This application is a divisional of U.S. application Ser. No. 10/312,404, filed Mar. 6, 2003, now U.S. Pat. No. 6,910,514, which is the U.S. National Stage of International Application No. PCT/JP01/05669, filed Jun. 29, 2001.

BACKGROUND OF THE INVENTION

1. Technical Field

The present invention relates to a component supply system for supplying electronic components to a component placement machine in which electronic components are mounted on a circuit substrate such as an electronic circuit board.

2. Description of the Related Art

FIG. 9 shows a conventional component placement machine generally indicated by reference numeral 10 for mounting electronic components on a circuit substrate. The component placement machine 10 has a component supply 11 for supplying electronic components 12, a placement head 13 for picking up components 12 from the component supply 11 and then placing the components 12 onto a circuit substrate 14, a transport device 15 for transporting the placement head 13 from one place to another, a recognition device 16 or a camera for recognizing positions, i.e., horizontal and angular positions, of the component 12 held by the placement head 13, a substrate holder 17 for supplying the circuit substrate 14 into the component placement machine 10 and then hold it in the machine, and a controller 18 for controlling overall operations of the component placement machine 10.

The component supply 11 holds one or more component supply cassettes 19. Each component supply cassette 19 supports a component supply reel 20 around which a tape carrying electronic components is wound. The placement head 13 has a vacuum quill 21 for sucking and thereby holding the component 12. The quill 21 is mechanically connected with an angular control mechanism 22 so that it can rotate about a vertical axis parallel to Z-axis indicated in the drawing to make an angular adjustment of the component held thereon. The transport device 15 has an X-axis transport mechanism 23 and Y-axis transport mechanism 24 for a horizontal movement of the placement head 13. The circuit substrate 14 may be a substrate on which one or more electronic components have already been mounted before being supplied into the placement machine. In this instance, additional electronic components 12 may be mounted on that particular circuit substrate. The recognition device 16 for recognizing the component 12 held by the quill 21 is electrically connected to an image processor 25 where an image picked up by the recognition device 16 is used for a determination whether the component is properly held on the quill or not.

In operation of the component placement machine 10 so constructed, the components 12 to be mounted are supplied to a component supply station (not shown in the drawing) by means of the component supply cassette 19 held by the component supply 11. The placement head 13 arrives above the component supply, and then the quill 21 moves down toward the component 12 and suck it. Then, the quill 21 moves up together with the component 12 held thereto. Subsequently, the placement head 13 is transported by the transport device 15 to a position opposing the recognition device 16. The recognition device 16 catches an image of the component 12 held by the quill 21. The image is then transmitted to the image processor 25. The image processor 25 performs a certain image process to determine possible horizontal and/or angular misalignment of the component 12, which is then transmitted to the controller 18. Using the determined misalignment, the controller 18 adjusts the position of the placement head 13 that is moving toward the circuit substrate 14, so that the component 12 is correctly positioned above the circuit substrate 14. The component 12 is then mounted onto the substrate 14 by the downward movement of the quill 21.

FIGS. 10 and 11 show the component supply cassette 19 and the reel 20 attached thereto. As best seen in FIG. 11, a number of components 12 are carried by a component carrier 26 in the form of a strip or a tape by having regular intervals 27 among each other. More specifically, the component carrier 26 has a base tape 28 having relatively large thickness. The base tape 28 has a number of cavities 29 or concave portions formed on one surface thereof at the regular intervals 27 so that in each of the cavities 29 a corresponding electronic component 12 is contained. To prevent the component 12 from dropping out of the cavity 29 and/or blocking invasion of dust into the cavity 29, one surface of the base tape 28 is covered with a thin top tape 30 in the form of a strip attached thereto. In operation of the component supply 11, a portion of the top tape 30 is peeled off immediately before reaching the component pickup station, thereby allowing the quill 21 to access the component 12 contained inside the cavity. The base tape 28 also has a number of perforations 31 formed therein at regular intervals.

As shown in FIG. 12, the component supply cassette 19 has a main frame 32 for defining a transport passage 33 of the component carrier, indicated by a dotted line. The main frame 32 carries a support shaft 34 on which the component supply reel 20 is detachably mounted, a shutter mechanism 35 for peeling off the top tape from the base tape and then exposing the component to the quill at the pickup station for the pickup operation of the component, a feed mechanism 36 for feeding the component carrier intermittently, a reel drive mechanism 38 for rotating a winding reel 37, and a tape guide member 39 for guiding the base tape after it has been separated from the top tape.

As shown in FIGS. 13A–13C and 14A–14D, the shutter mechanism 35 has a fixed guide 40 along and under which the component carrier 26 is transported. The fixed guide 40 has an upstream guide plate 41 and a downstream guide plates 42 positioned on upstream side and downstream side, respectively, of a direction indicated by an arrow 43, along which the component carrier is transported, and thereby defining an opening 44 between these two guide plates 41 and 42. A movable guide plate or a shutter 45 in the form of plate is positioned between the upstream and downstream guide plates 41 and 42. The shutter 45 is arranged to move back and forth in the carrier transporting direction 43 between a first position adjacent to the upstream guide plate 41 where it opens the component pickup station 46 for allowing the quill to access the component, and a second position adjacent to the downstream guide plate 42 where it closes the component pickup station 46, preventing the quill to access the component. For this purpose, the shutter 45 is drivingly connected with the feed mechanism 36, which will be described below. The movable shutter 45 has a slot 70 extending in a transverse direction through which the peeled top tape is pulled out toward the winding reel 37.

As shown in FIG. 15, the reel drive mechanism 38 of the component supply cassette has a support shaft 47 around which the winding reel 37 is supported for rotation. The shaft 47 is connected with an operation lever 48 and a winding lever 49. In turn, the operation lever 48 is connected with one end of a linkage 50 for moving the shutter 45, and the winding lever 49 is connected at its free end with a biasing spring 51 so that the levers 48 and 49 are biased in a direction indicated by an arrow 52 (i.e., counterclockwise direction in the drawing). A one-way clutch 53 is disposed between the support shaft 47 and the winding reel 37 so that the winding reel 37 follows rotation of the levers 48 and 49 in the clockwise direction in the drawing but it does not follow rotation of these levers in the counterclockwise direction. That is, when the operation lever 48 is rotated in the clockwise direction against the biasing spring 51, the winding reel 37 rotates in the same direction for winding a certain length of the peeled top tape, and when the operation lever 48 is rotated by the biasing spring 51 in the counterclockwise direction, the winding reel 37 stays without any rotation.

As shown in FIG. 16, the feed mechanism 36 of the component supply cassette for intermittent transportation of the component carrier includes a shaft 52 around which a wheel lever 53 is rotatably secured. The wheel lever 53 is connected to the other end of the linkage 50 (see FIG. 15) through a pivot 54 so that the linkage 50 may rotate about the pivot 54 freely. The wheel lever 53 has an actuator 55 or lever defined therein, which engages with the shutter 45. Specifically, the shutter 45 has a side plate 56 defined with a U-shaped cutout 47 with which the actuator 55 engages. This allows that rotation of the wheel lever 53 causes the shutter 45 to move back and forth in the carrier transporting direction 43.

For the purpose of intermittent feeding of the base tape, a feed wheel 58 and a ratchet wheel 59 secured to the feed wheel 58 by bolts 60 are supported for rotation about the shaft 52 through a one-way clutch 61. The one-way clutch 61 functions so that the feed and ratchet wheels 58 and 59 follow rotation of the wheel lever 53 in the counterclockwise direction 62 in the drawing but they do not follow the rotation of the wheel lever 53 in the clockwise direction 63. The ratchet wheel 59 is provided at its periphery with a number of teeth 64.

A ratchet lever 65 is rotatably secured to the wheel lever 53 and it engages with ratchet teeth 64 of the ratchet wheel 59. A stop lever 66 is rotatably secured to the frame of the cassette and it also engages with ratchet teeth 64 of the ratchet wheel 59 so as to prevent free rotation of the wheels 58 and 59 in the clockwise direction but it allows rotation of these wheels in the counterclockwise direction in the drawing. In order to feed the base tape 28 in synchronism with rotation of the wheel 58, the feed wheel 58 is provided at its periphery with a number of teeth 67 for engagement with the perforations 31 formed in the base tape 28.

In operation, the operation lever 48 is rotated in the clockwise direction in FIG. 15. Upon this rotation, the winding reel 37 is rotated in the same direction and wind up peeled top tape. At the same time, a certain length of the top tape located near the slot 70 of the shutter is peeled off from the base tape. Rotation of the operation lever 48 also rotates the wheel lever 53 in the direction 63 shown in FIG. 16, and this causes movement of the shutter 45 against the component carrier transporting direction 43. As a result, the component 12 is exposed to the quill 21 at the pickup station 46. With the rotation of the wheel lever 53 in the direction shown by the arrow 63, the ratchet lever 65 slides over several teeth 64 of the ratchet wheel 59. Throughout this rotation, the stop lever 66 continues to engage with one specific tooth 64 of the ratchet wheel 59, so that the ratchet wheel 59 as well as the feed wheel 58 stays without rotation.

Then, when the operation lever 48 is released, the lever 48 rotates in the counterclockwise direction by the biasing force of the spring 51, as shown in FIG. 15. By this rotation of the operation lever 48, the linkage 50 rotates the wheel lever 53 in the counterclockwise direction in FIG. 16. As shown in FIG. 16, with this rotation of the wheel lever 53, the ratchet lever 65 engaged with a certain tooth 64 of the ratchet wheel 59 causes the ratchet wheel 59 as well as the feed wheel 58 to rotate in the counterclockwise direction. At this moment, the stop lever 66 slides over the ratchet teeth 64 so as to allow rotation of the ratchet wheel 59 relative to the stop lever 66. Also, by rotation of the actuator 55, the shutter is moved in the direction shown by the arrow 43 to close the component pickup station 46.

With the rotation of the feed wheel 58 in the counterclockwise direction, the base tape 28 is forwarded by a certain distance in the direction 43 due to engagement of its perforations 31 with the tooth 67. This causes the subsequent cavity 29 and the component 12 contained therein to be moved to the component pickup station 46. By repetition of the above-described operations, the components 12 carried by the component carrier 26 are picked up by the quill 21 one after another intermittently, and then mounted on the circuit substrate.

The size of electronic components supplied by tapes or component carriers varies in a wide range. For example, a relatively small component has a size of 1.0 mm×0.5 mm×0.5 mm or even 0.6 mm×0.3 mm×0.3 mm. Generally, each component is contained inside the cavity of the component carrier in a most stable condition, i.e., with its major surface faces vertically. Although, in case of a particularly small and lightweight component, it is likely to bounce up and around inside the cavity because of vibrations transmitted not only from driving mechanism included in the component supply cassette itself but also from others included in devices located nearby.

Therefore, after the top tape is peeled off from the base tape, if nothing exists in place of the top tape, it may happen that the component takes an upright position with its major surface faces horizontally. This is so problematic because the component in such an upright position prevents its correct mounting onto the circuit substrate as well as its vacuum sucking by the quill.

In order to solve this problem, a variety of techniques related to the mechanisms to be employed around the component pickup station have been developed. In one example, as shown in FIGS. 13A to 13C, upper side guide member of the component supply cassette is separated into two guide plates 41 and 42. The shutter 45 is then provided between these two guide plates 41 and 42 so that the shutter 45 may move between the first position adjacent to the upstream guide plate 41, and the second position adjacent to the downstream guide plate 42.

With this arrangement, as shown in FIG. 13A, when the shutter 45 takes the first position, the electronic component (not shown in the drawing) is exposed between the shutter 45 and the downstream guide plate 42, thereby the component may be picked up by the quill. After the pickup operation of the component, as shown in FIG. 13B, the shutter 45 moves to the second position adjacent to the downstream guide plate 42. At the same time, the component carrier 26 is forwarded by a predetermined distance, so that the subsequent component 12 is transported to the pickup station 46. At this moment, as can be seen from the drawing, the component to be picked up is still covered by the shutter 45. This prevents the component from taking the upright position. Next, as shown in FIG. 13C, the shutter 45 moves backward to the first position adjacent to the upstream guide plate 41. This allows the component 12 to be picked up by the quill.

During such an operation, as shown in FIGS. 14A to 14D, the top tape 30 is peeled off from the base tape 28 at the movement of the shutter 45 from the second position to the first position in synchronism with the rotation of the winding reel. Disadvantageously, after this backward movement of the shutter 45 uncovering the base tape results in that revealed portion of the base tape 28 is subject to vibrations, which causes the component 12 to bounce up and around inside the cavity 29. Eventually, this may cause difficulties in the subsequent vacuum sucking operation by the quill.

In addition, especially for the case of a relatively vulnerable base tape, e.g., the base tape for chip components having a size of 0.6 mm×0.3 mm (so called 0603 chips), as shown in FIG. 14D, the movement of the shutter 45 from its first position to the second position may drag the revealed part of such base tape 28 and nip it with the second guide plate 42, which results in the transport defect of the component carrier 26.

Besides, a variety of research studies revealed that deformation of a portion of the base tape adjacent to the downstream guide plate where the base tape is disengaged from the feed wheel transmits vibration to the component in the pickup station. More specifically, as shown in FIG. 17, in the conventional component supply cassette, the downstream guide plate 42 is designed to provide a minimum frictional force to the disengaging base tape 28. Also, a third guide plate 71 is positioned on the downward side of the downstream guide plate 42 for directing the disengaged base tape 28 downward so that it defines a relatively large space 72 with respect to the feed wheel 58. This causes the disengaged base tape 28 to travel in a direction substantially parallel to the tangential line of the wheel 58. However, the disengaged and curved tape 28 encourages vibration which is then transmitted to the other portion of the base tape 28 located in the pickup station, causing the component to bounce up and take an upright position inside the cavity.

Also, another technique has been disclosed in Japanese patent publication 9-186487 (A) for preventing the bouncing of the component. Specifically, as shown in FIG. 18, a permanent magnet 75 is disposed under the tape transport passage in a region of the tape peeling station and the component pickup station. The permanent magnet 75 attracts the components positioned in this area, where the top tape for covering such components has been peeled off, so as to retain these components in their proper position inside the corresponding cavities. This arrangement may effectively prevent the component from bouncing up or dropping out of the cavity caused by vibrations as well as an electrostatic force generated as a result of peeling off of the top tape.

In the meantime, electronic components to be mounted on the circuit substrate typically use magnetic materials for their electrodes, which makes the electronic components to be attracted by the magnet. However, if the electrodes are plated with palladium, or the component itself is in a very small size, the magnetic force attracting such a component is considerably weak. Even such small components, however, may be attracted by enhancing the magnetic field of the magnet as much as, for example, 100 Gausses or above.

In order to facilitate pickup operation by the quill 21 even with the existence of such magnetic attraction force, a thrust pin 76 may be disposed under the pickup station 46 as indicated by the dotted line in the drawing. The thrust pin 76 is mechanically connected with the operation lever 48 so that, when the lever 48 is rotated in the clockwise direction in the drawing, the thrust pin is driven to move upward. As shown in FIG. 19, in order to allow the thrust pin 76 to contact a bottom surface of the component 12 and lift it up, there is formed a through-hole 77 in a corresponding portion of the magnet 75.

Although the thrust pin 76 effectively helps the vacuum quill 21 for picking up the component 12, this arrangement tends to increase the vacuum force F2 (see FIG. 20) needed for the quill 21 to pick up the component 12. This means that an excessive attraction force F1 (see FIG. 20) by the magnet 75 will make it difficult for the vacuum quill 21 to pick up the component 12, which in turn limits the attraction force by the magnet 75. Also, the magnetic field generated around the pickup station 46 may cause an adverse affect on positioning the component 12 held by the quill 21 in a proper condition.

In addition, due to bouncing of the component inside the cavity may dislocate a contact position between the component and the thrust pin. In this instance, the larger component may be held properly by the quill in a correct position, whereas the smaller component may be held by the quill in an incorrect position.

SUMMARY OF THE INVENTION

The present invention is developed to solve the above mentioned drawbacks that conventional component placement machine involves.

Specifically, one aspect of the present invention is related to an apparatus for supplying a component carrier in the form of a tape, said component carrier has a number of cavities formed on one surface thereof for containing components, comprising:

a pair of spaced first and second guide plates along which said one surface of said component carrier is guided;

a movable guide plate disposed between said first and second guide plates so that it can move back and forth between a first position which is adjacent to said first guide plate to define a component pickup station between said movable guide plate and said second guide plate, and a second position which is adjacent to said second guide plate; and an extension formed integrally with one of said movable guide plate and said second guide plate, said extension extending between said movable guide plate and said second guide plate along at least one longitudinal edge of said component carrier and opposing to said one surface of said component carrier when said movable guide plate takes said first position.

Another aspect of the present invention is related to an apparatus for supplying a component carrier in the form of a tape, said component carrier having a base tape in which a number of cavities are formed on one surface thereof for containing components and a top tape attached on said one surface of said base tape, wherein a certain length of said top tape is intermittently peeled off from said base tape so that one of said components is exposed at a pickup station where a pickup member reaches and picks up said exposed component, comprising:

a passage along which said component carrier is transported;

an electromagnetic device provided in said pickup station and adjacent to said base tape but away from said top tape;

a controller for controlling said electromagnetic device in such a manner that said electromagnetic device may attract and hold said component in position inside said cavity.

Yet another aspect of the present invention is related to an apparatus for supplying a component carrier in the form of a tape, said component carrier having a base tape in which a number of cavities are formed on one surface thereof for containing components and a top tape attached on said one surface of said base tape, wherein a certain length of said top tape is intermittently peeled off from said base tape at a peeling station, comprising:

a passage along which said component carrier is transported;

an electromagnetic device provided in said peeling station and adjacent to said base tape but away from said top tape;

a controller for controlling said electromagnetic device in such a manner that said electromagnetic device may attract and hold said component in position inside said cavity.

Yet another aspect of the present invention is related to an apparatus for supplying a component carrier in the form of a tape, said component carrier having a base tape in which a number of cavities are formed on one surface thereof for containing components and a top tape attached on said one surface of said base tape, wherein a certain length of said top tape is peeled off from said base tape at a peeling station to expose one of said components and then said exposed component is picked up from said cavity at a pickup station, comprising:

a passage along which said component carrier is transported;

a first electromagnetic device provided in said pickup station for attracting said component in position within said cavity;

a second electromagnetic device provided in said peeling station for attracting said component in position within said cavity;

a controller for controlling said first and second electromagnetic devices in such a manner that said first electromagnetic device is turned off before a pickup operation of said component and turned on after said pickup operation, and that said second electromagnetic device is turned on before a peeling operation of said top tape and turned off after said peeling operation.

Another aspect of the present invention is related to a method for supplying a component carrier in the form of a tape, said component carrier having a base tape in which a number of cavities are formed on one surface thereof for containing components and a top tape attached on said one surface of said base tape, wherein a certain length of said top tape is peeled off from said base tape at a peeling station to expose one of said component which is then picked up from said cavity at a pickup station, comprising steps of:

providing a passage along which said component carrier is transported;

providing an electromagnetic device in said pickup station for attracting said component in position within said cavity;

controlling said electromagnetic device in such a manner that said electromagnetic device is turned into off status before a pickup operation of said component and turned into on status after said pickup operation.

Still another aspect of the present invention is related to a method for supplying a component carrier in the form of a tape, said component carrier having a base tape in which a number of cavities are formed on one surface thereof for containing components and a top tape attached on said one surface of said base tape, wherein a certain length of said top tape is peeled off form said base tape at a peeling station to expose one of said components, comprising steps of:

providing a passage along which said component carrier is transported;

providing an electromagnetic device in said peeling station for attracting said component in position within said cavity;

controlling said electromagnetic device in such a manner that said electromagnetic device is turned into on status before a peeling operation of said top tape and turned into off status after said peeling operation.

Still another aspect of the present invention is related to a method for supplying a component carrier in the form of a tape, said component carrier having a base tape in which a number of cavities are formed on one surface thereof for containing components and a top tape attached on said one surface of said base tape, wherein a certain length of said top tape is peeled off from said base tape at a peeling station to expose one of said components and then said exposed component is picked up from said cavity at a pickup station, comprising steps of:

providing a passage along which said component carrier is transported;

providing a first electromagnetic device in said pickup station for attracting said component in position within said cavity;

providing a second electromagnetic device in said peeling station for attracting said component in position within said cavity;

controlling said first and second electromagnetic devices in such a manner that said first electromagnetic device is turned into off status before a pickup operation of said component and turned into on status after said pickup operation, and that said second electromagnetic device is turned into on status before a peeling operation of said top tape and turned into off status after said peeling operation.

Yet another aspect of the present invention is related to an apparatus for supplying a component carrier in the form of a tape, said component carrier having a base tape in which a number of cavities are formed on one surface thereof for containing components and a top tape attached on said one surface of said base tape, wherein a certain length of said top tape is peeled off from said base tape at a peeling station to expose one of said components and then said exposed component is picked up from said cavity at a pickup station, said base tape further including a number of perforations formed therein at regular intervals, comprising:

a rotatable wheel having a number of teeth formed around a periphery thereof for engagement with said perforations in said pickup station so as to transport said base tape through rotation of said wheel;

a guide member provided adjacent to said pickup station for ensuring said engagement between said perforations and said teeth; and an support guide member provided adjacent to said periphery of said wheel and in a region where a portion of said base tape is about to disengage from said teeth, said support guide member being configured to increase a length of engaged portion formed by said perforations and said base tape.

BRIEF DESCRIPTION OF THE DRAWINGS

FIGS. 4A–4C show a timing chart for an operation of the apparatus for supplying a component carrier shown in FIGS. 3A–3D, FIGS. 5A–5D show a variation of the apparatus for supplying a component carrier shown in FIGS. 3A–3D, FIGS. 6A–6D show another variation of the apparatus for supplying a component carrier shown in FIGS. 3A–3D.

DETAILED DESCRIPTION OF THE PREFERRED EMBODIMENTS

Figure 1A:
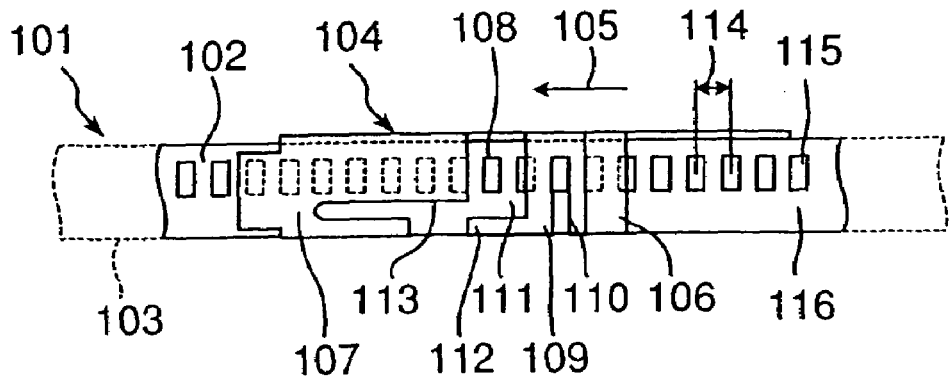
FIGS. 1A–1C show fragmental plan views of an apparatus for supplying a component carrier according to the first embodiment of the present invention.

Preferred embodiments of the present invention will be described hereinafter by referring to appended drawings. Throughout the drawings, like elements bear like reference numerals.

First Embodiment

Figure 1B:
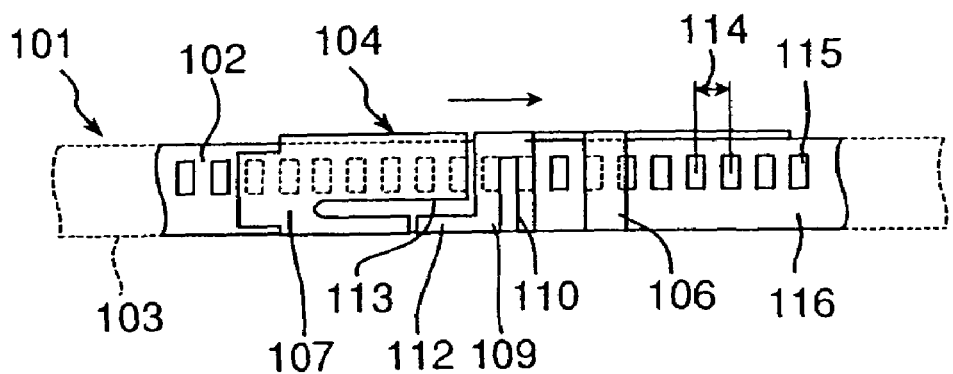
Figure 1C:
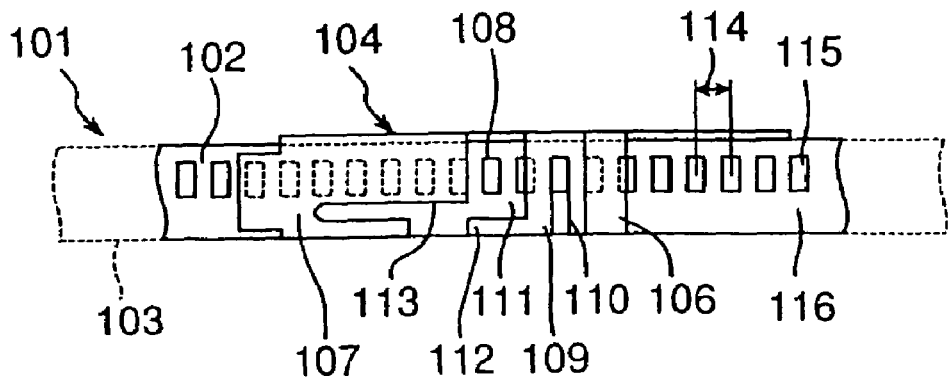

FIGS. 1A–1C show a portion of an apparatus for supplying a component carrier 101 used for a component placement machine, illustrating a structure in the area including a pickup station. Referring to these drawings, the apparatus 101 of the present invention includes a passage 103 for component supply tape or a component carrier in a similar manner as the conventional component supply cassette described above. The passage 103 is formed between a lower side guide (not shown in the drawing) and an upper side guide 104. so that the component carrier 102 is transported intermittently toward a direction shown by an arrow 105 while it is guided between both of these lower side and upper side guides.

Although not shown in the drawing, the lower side guide is secured to the frame of the component supply cassette. The upper side guide 104 includes an upstream guide plate 106 and a downstream guide plate 107, or fixed plates, both of which are disposed at upstream and downstream sides, respectively, of the component carrier transport direction shown by the arrow 105, by having a space or an opening 108 between them. At the location of the opening 108, a movable guide plate, or a shutter 109 is provided, which has a slot 110 oriented orthogonal to the carrier transport direction shown by the arrow 105. The movable guide plate 109 is linked to a shutter driving mechanism (not shown in the drawing) so as to be moved back and forth along a direction shown by the arrow 105. Namely, the movable guide plate 109 can move back and forth between the first position close to the upstream guide plate 106 where component pickup station 111 is formed between the movable guide plate 109 and the downstream guide plate 107 as shown in FIG. 1A, and the second position close to the downstream guide plate 107 where an opening is formed between the movable guide plate 109 and the upstream guide plate 106.

The movable guide plate 109 has an arm, or a extension 112, which is integrally formed with the movable guide plate 109 and extends in the carrier transporting direction toward the downstream guide plate 107. When the movable guide plate 107 takes the first position, the extension 112 extends substantially the whole span of the opening 108 in the carrier transport direction 105, thereby preventing movement or vibration of the component carrier 102 located between the movable guide plate 109 and the downstream guide plate 102 where the opening 108 for component pickup is formed. On the other hand, the downstream guide plate 107 has a cutout 113 or a receiving space, in order to avoid interference with the extension 112 of the upstream guide plate 106 when the movable guide plate 109 takes the second position.

In accordance with the component supply 101 so structured, the component carrier 102 is transported intermittently by a predetermined distance 114 toward a direction shown by the arrow 105. In the same manner as the conventional component carrier described above, the component carrier 102 includes a base tape having cavities 116 for containing components 115, and a top tape for covering the cavities 116. The top tape is taken out through the slot 110 formed on the movable guide plate 109 after it is peeled off from the base tape, and then is wound around the reel not shown in the drawing. The component 115, with its covering top tape has been peeled off, is exposed at the component pickup station 111 located between the movable guide plate 109 and the downstream guide plate 107, and then the component is picked up by sucking operation of the quill not shown in the drawing.

After the component 115 is picked up, the movable guide plate 109 moves from the first position to the second position, as shown in FIGS. 1A and 1B. In this instance, the component carrier 102 is also transported simultaneously toward the direction shown by the arrow 105 by a predetermined distance, which in turn the subsequent component 115 is positioned at the component pickup station 111.

At the next stage, the movable guide plate 109 moves backward from the second position to the first position, as shown in FIGS. 1B and 1C. During this movement, a certain length of the top tape is peeled off from the base tape, and peeled top tape is taken out through the slot 111 and wound around the winding reel. As a result, the component 115 is exposed at the component pickup station, and is ready for pickup operation by the quill.

As is understood from the above, when the movable guide plate 109 takes the first position, movement or vibration of the component carrier located between the movable guide plate 109 and the downstream guide plate 107 is restricted by the extension 112 of the movable guide plate 109. Accordingly, even if vibration from other mechanism is transmitted to the component carrier, the component carrier is not vibrated at all or substantially not vibrated. Therefore, the component exposed at the pickup station does not bounce up nor move around inside the cavity 116, and this may leads to achieve proper sucking and pickup operation by the quill. In addition, since a portion of the component carrier located at the pickup station 111 does not slacken or stagnate when the movable guide plate 109 moves toward the second position, this portion of the component carrier would not be nipped or stuck between the movable guide plate 109 and the fixed plate, and hence stable transportation of the component carrier may be realized.

Furthermore, the downstream guide plate 107 has a cutout 113 corresponding to the extension 112 of the movable guide plate 109, which may receive the extension 112 when the movable guide plate 109 moves to the second position, and thus any interference between these two may be avoided.

Figure 2:
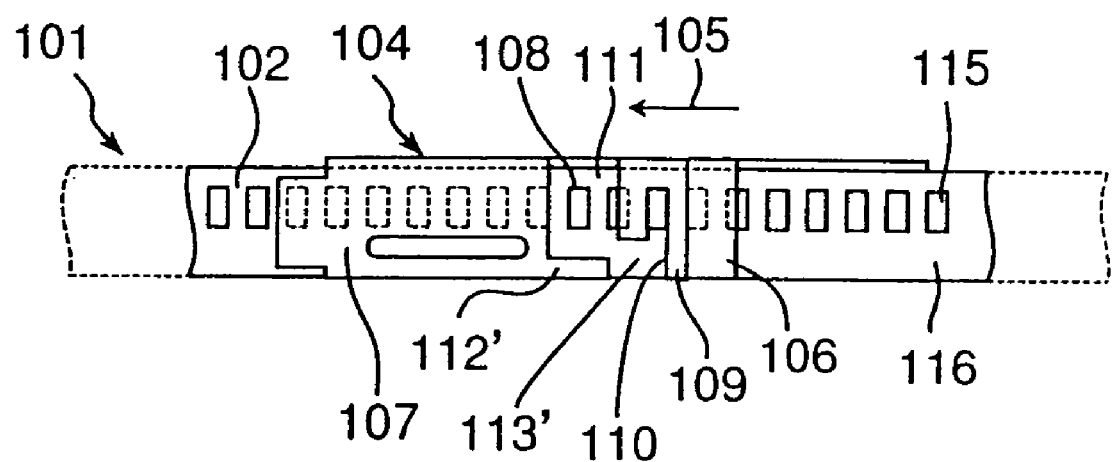
FIG. 2 shows a variation of the apparatus for supplying a component carrier shown in FIGS. 1A–1C, FIGS. 3A–3D show fragmental plan views of an apparatus for supplying a component carrier according to the second embodiment of the present invention.

In the illustrated embodiment, the extension 112 spanning the pickup station 111 is formed to the movable guide plate 109, while the cutout 113 opposing the extension 112 is formed in the downstream guide plate 107. Alternatively, this arrangement may be reversed, i.e. the downstream guide plate 107 may have an extension 112', while the movable guide plate 109 may have a cutout 113', as shown in FIG. 2.

Also in the illustrated embodiment, although only one extension is formed extending along one longitudinal side edge of the component carrier, two extensions may be formed along both side edges of the component carrier extending from either the movable guide plate or the fixed plate.

Although the present embodiment has been described referring to an apparatus for supplying a component carrier in a form of a component supply cassette, the present invention may be applicable to the other types of apparatus for supplying component carrier which are not in the form of the component supply cassettes.

Second Embodiment

Referring to FIG. 3, an apparatus for supplying a component carrier shown in the drawing has an electromagnet 123 below the tape peeling station 121 and the component pickup station 122. In the drawing, the electromagnet 123 is illustrated in contact with the bottom surface of the component carrier 102. In such an arrangement, preferably the electromagnet 123 is installed in the opening formed in a guide member which guides the bottom surface of the component carrier 102. Alternatively, the electromagnet may be deployed beneath the guide member. For this case, such guide member is preferably formed by non-magnetic material. The electromagnet 123 is electrically connected to a controller 124, and "on" or "off" status of the electromagnet 123 is controlled by a signal outputted from the controller 124.

Figure 3A:
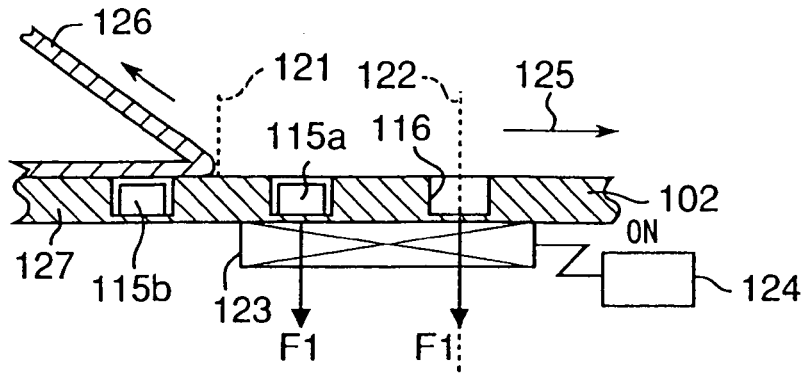
Figure 3B:
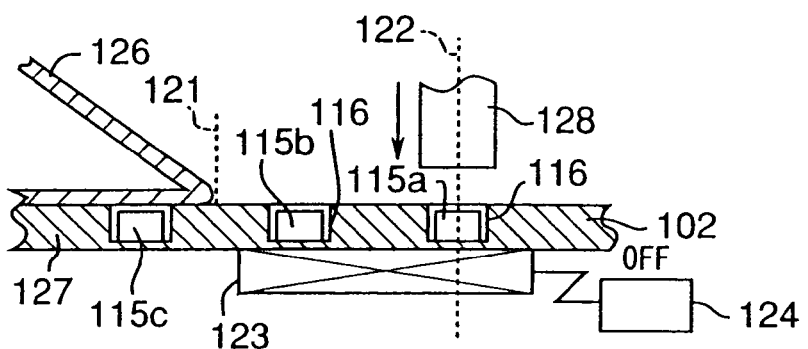
Figure 3C:
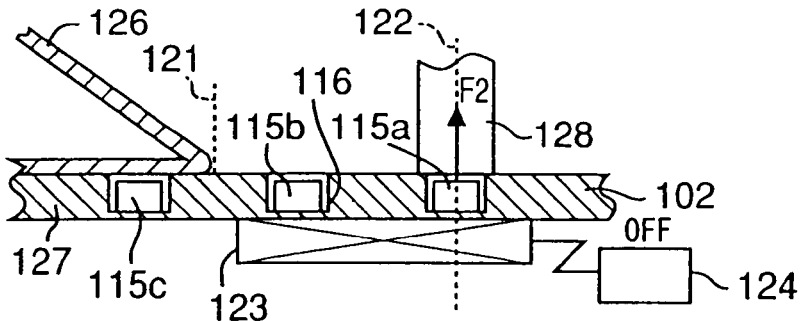
Figure 3D:
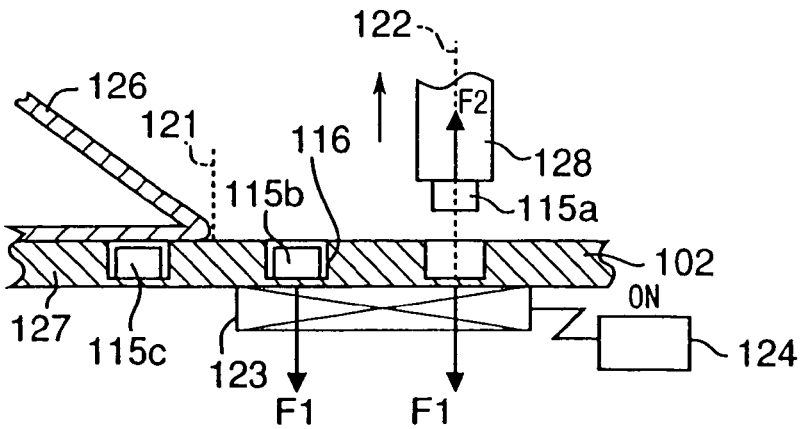

The operation of the controller 124 and component pickup will now be described by referring to FIGS. 3A–3D and 4A–4C. FIG. 3A shows a stage immediately after the component is picked up at the component pickup station. At this stage, the electromagnet 123 is in "on" status. Then, as shown in FIGS. 3A and 3B, the component carrier 102 is transported toward a direction shown by an arrow 125 by a predetermined distance, and the subsequent component 115a is positioned at the component pickup station 122, during which the electromagnet is kept in "on" status. At this instance, a portion of the top tape 126 covering the following component 115b is peeled off from the corresponding portion of the base tape 127 at the top tape peeling station 121. Thus, the component 115a is forced to be placed in position inside the cavity 116 due to the attraction force (F1) generated by the electromagnet 123, and the component would not drop off from the cavity 116. Subsequently, when the quill 128 approaches toward the component 115a at the pickup station 122, the electromagnet 123 is changed to be in "off" status. Accordingly, as shown in FIG. 3C, the quill 128 may easily pick up the component 115a with sucking force (F2). After the component 115a is picked up by the quill 128, the electromagnet 123 is reversed to "on" status, and this causes the following component 115b to be kept at a stable condition inside the cavity 116.

As described above, the component 115 is retained in a stable condition inside the cavity 116 during transportation due to the effect of the magnetic field generated by the electromagnet 123. On the other hand, at the time of picking up of the component 115, since the electromagnet 123 is turned into "off" status, the quill 128 may easily pick up the component 115 without being disturbed by any magnetic field. Therefore, excessive sucking force of the quill 128 may not be required. Further, even for the case of the component 115 with a small size, or the component 115 made from a material with low ratio of magnetic, such component 115 may also be kept in position in a stable condition inside the cavity 116 by enhancing the magnetic force of the electromagnet 123. This enhanced magnetic force does not affect sucking operation of the quill 128 at all, since electromagnet 123 is turned into "off" status during the component pickup operation. Also, the magnitude of the magnetic force to be generated by the electromagnet 123 may be adjusted by the controller 124 depending upon the size or the weight of the component 115.

Figure 5A:
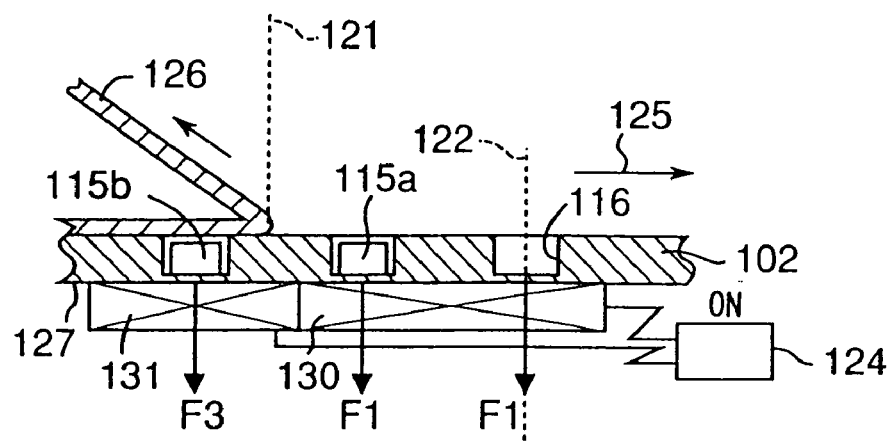
Figure 5B:
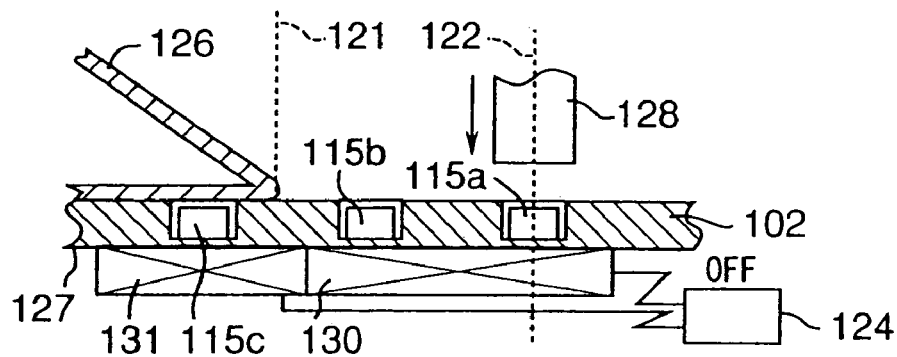

An alternative arrangement of the electromagnet is shown in FIGS. 5A–5D, in which the first electromagnet 130 is disposed at the area of the component pickup station 122, and the second electromagnet 131 is disposed at the area of the tape peeling station 121. Both of these electromagnets 130 and 131 are arranged to be controlled independently. In this arrangement, at the stage immediately after component pickup at the pickup station, both first and second electromagnets 130 and 131 are in an "on" status. As shown in FIGS. 5A and 5B, the component carrier 102 is transported through a predetermined distance toward the direction shown by an arrow 125, while both of the electromagnets 130 and 131 are kept in "on" the status. By this movement, the subsequent component 115a is positioned at the component pickup station 112. On the other hand, at the tape peeling station 121, a portion of the top tape covering the following component 115b is peeled off from the corresponding portion of the base tape 127. During this peeling procedure, static electricity may be charged depending on the materials used for the top tape 126 and/or the base tape 127. Such electrostatic force may affect the component contained inside the corresponding cavity 116 where the top tape has been peeled off, which may cause unstable condition of the component 115b. Thus, if vibration is transmitted to the particular component 115b, it may easily move or bounce up into a vertical position. According to the present embodiment, however, a magnetic force F3, generated by the second electromagnet 131, keeps the component 115b in a stable condition inside the cavity 116, and therefore, the component may not move around or turn into a vertical position due to such electrostatic force. The magnitude of such electrostatic force may vary depending on the materials used for the top tape 126 and/or the base tape 127. Accordingly, it is desirable that the magnetic force to be generated by the second electromagnet 131 is adjusted depending on the materials of these tapes, as well as the size and/or weight of the component. Toward this end, it is desirable to store necessary data relating to the magnetic characteristics on a component by component basis in the controller 124 (specifically, voltage to be applied to the electromagnet) so that the electromagnets may generate appropriate magnetic force for each of the corresponding components.

Figure 5C:
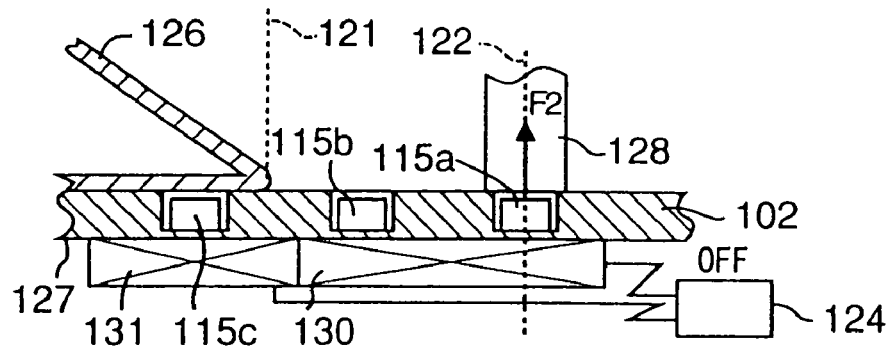
Figure 5D:
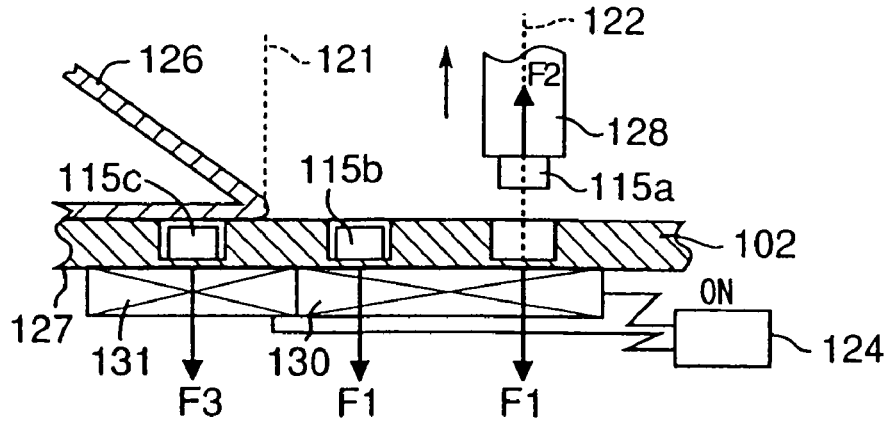

After the component carrier is moved from the position of FIG. 5A to the position of FIG. 5B, both the first and the second electromagnets 130 and 131 are turned to an "off" status. Thus, as shown in FIG. 5C, subsequent sucking and pickup operation of the component 115a by means of the sucking force (F2) of the quill 128 may easily be conducted. After completion of sucking of the component 115a by the quill 128, the first and the second electromagnets 130 and 131 are turned to the "on" status again, which causes the component 115b to be kept in position inside the cavity in a stable condition. Under such stable condition, the component carrier 102 is transported for the predetermined distance, during which the top tape 126 is peeled off from the base tape 127 at the tape peeling station 121. Since the component 115b is kept in a stable condition by means of the electromagnet 130, the component 115b does not bounce up nor turn into a vertical position due to the static electricity charged during peeling of the top tape 126.

Figure 6A:
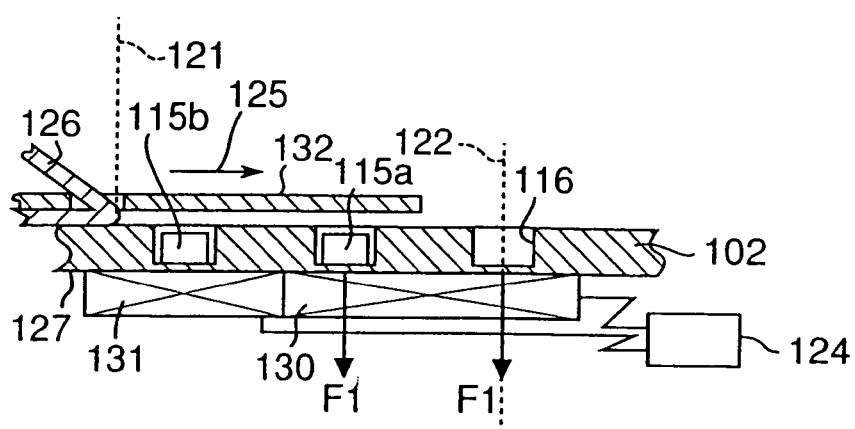
Figure 6B:
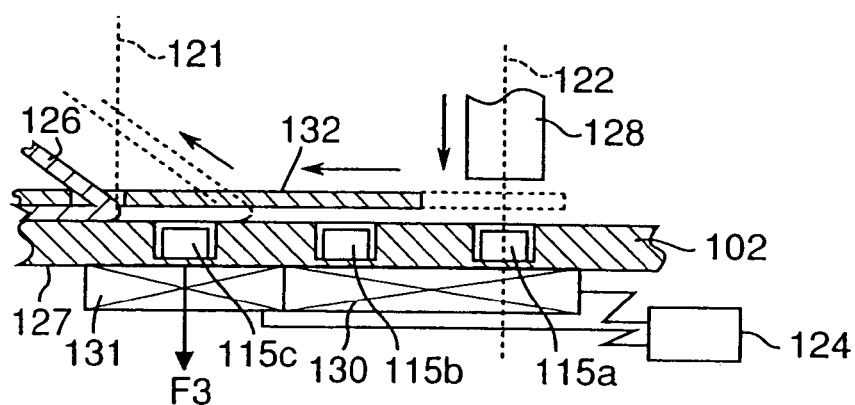
Figure 6C:
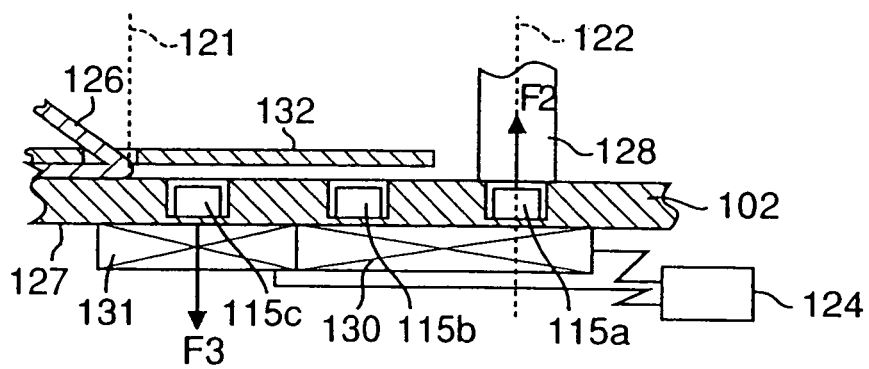
Figure 6D:
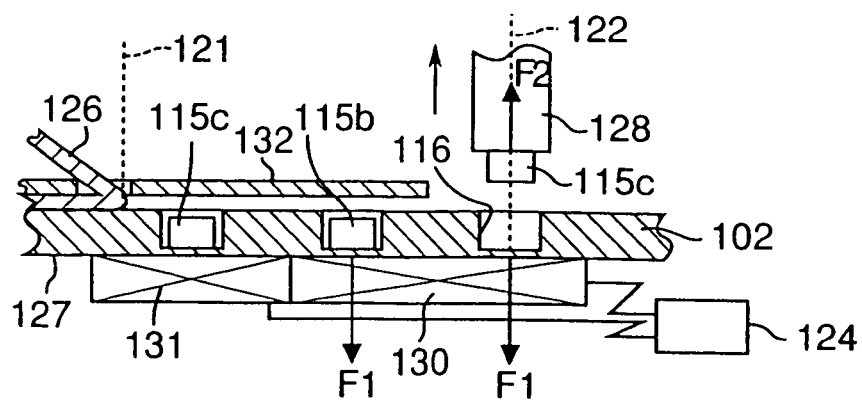

When the component supply has the movable guide plate, or a shutter as in the case described in the background section, the first and the second electromagnets may be controlled differently as follows. For example, FIG. 6A shows a stage immediately after the component is picked up at the component pickup station 122. In such an instance, the first electromagnet 130 is in the "on" status. During this timing, the second electromagnet 131 may be in either "off" status or "on" status. Then, in FIG. 6B, the component carrier 102 is transported by a predetermined distance toward the direction shown by an arrow 125, during which either only the first electromagnet 130, or both of the first and the second electromagnets 130 and 131 are in the "on" status. By this movement, the subsequent component 115a is now positioned at the component pickup station 122. During this stage, the movable guide plate 132, which is structured to move simultaneously with the component carrier 102, is also moved by the equivalent distance (as illustrated by dotted lines) toward the direction shown by the arrow 125. Therefore, there is no relative movement between the movable guide plate 132 and the component carrier 102, hence the top tape 126 is not peeled off during this movement. Then, still in FIG. 6B, the movable guide plate 132 moves backward from the position shown by the dotted lines to the position shown by solid lines. During such backward movement of the movable guide plate, the tape winding reel, not shown in the drawing, is rotated, and the portion of the top tape located at the tape peeling station 121 is peeled off from the base tape 127. During this tape peeling operation, at least the second electromagnet 131 is turned into the "on" status for preventing the following component 115c from bouncing up due to the electrostatic force possibly charged during this period. The first electromagnet 130 is turned into "off" status when the quill 128 picks up the component 115a. After completion of component pickup, only the first electromagnet 130, or both of the first and the second electromagnets 131 and 131 are turned into "on" status again, and the component carrier 102 is transported by a predetermined distance.

As such, in order to prevent movement of the component, the second electromagnet 131 is turned into "on" status at least during the time when the top tape is peeled off due to the backward movement of the movable guide plate 132. Alternatively, the second electromagnet 131 may be kept in "on" status all the time so that the second electromagnet 131 may attract nearby components in position throughout the operation.

Third Embodiment

Figure 7:
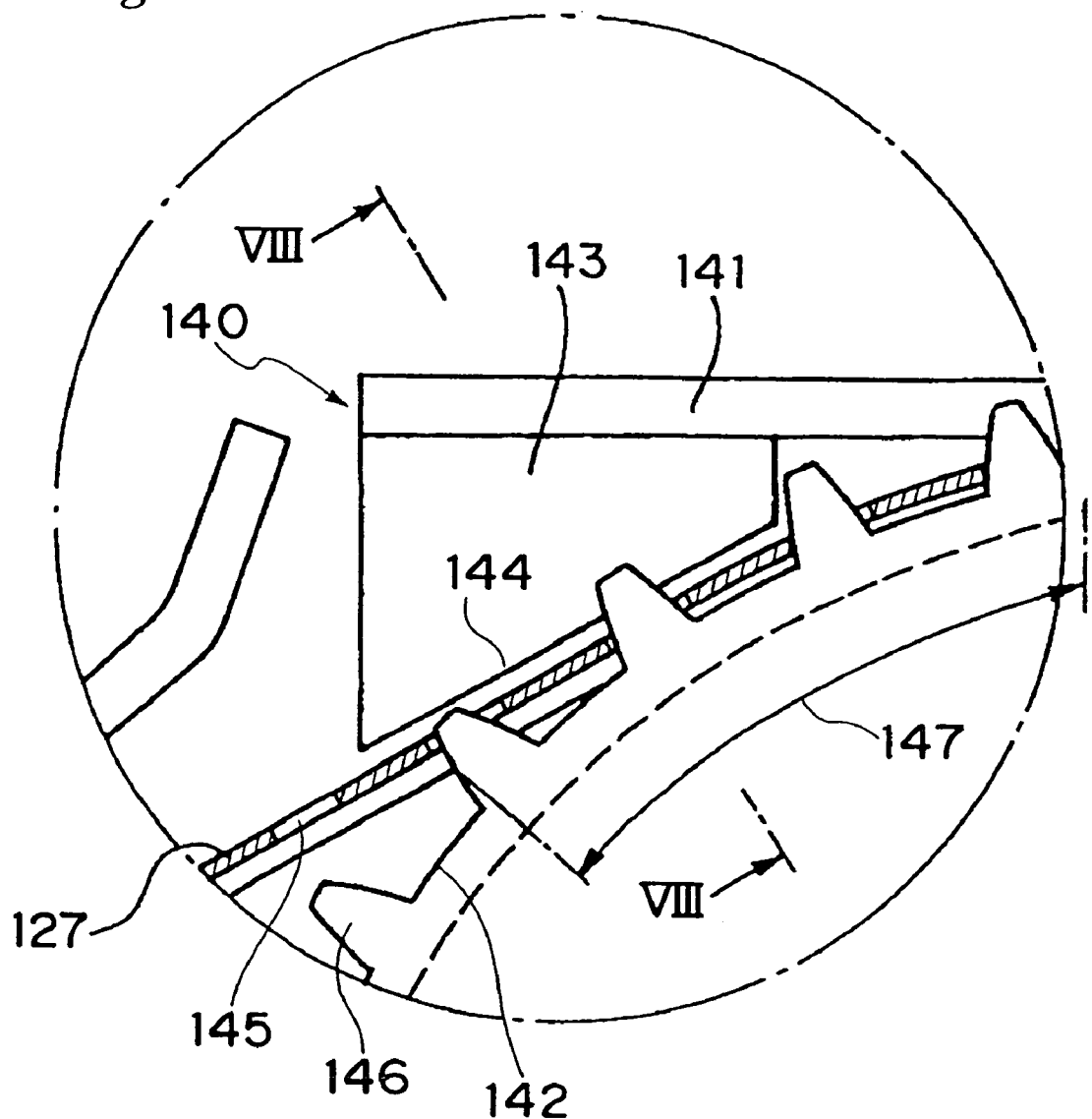
FIG. 7 shows a fragmental plan view of an apparatus for supplying a component carrier according to the third embodiment of the present invention.
Figure 8:
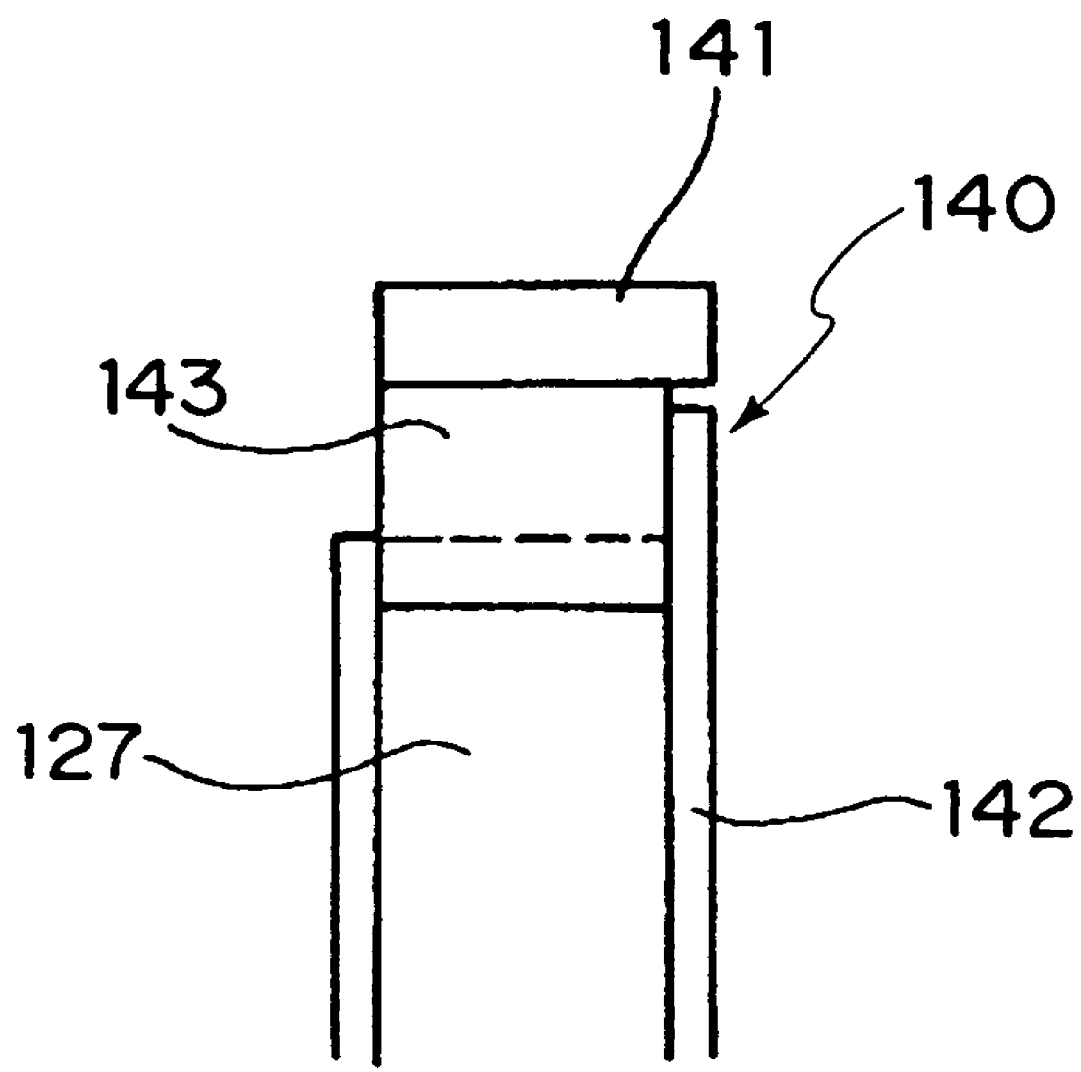
FIG. 8 shows a cross sectional view at VIII—VIII line in FIG. 7.
Figure 9:
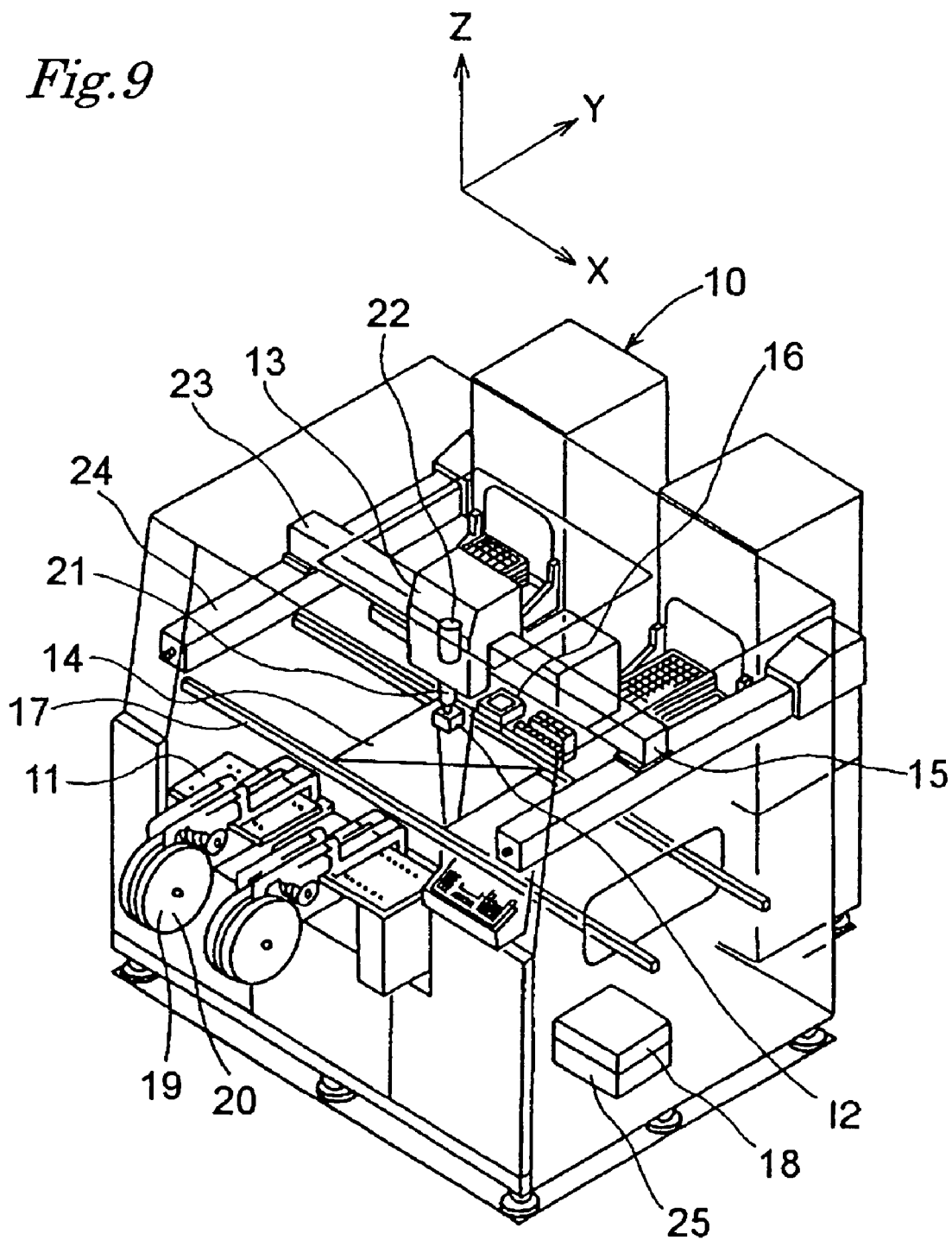
FIG. 9 shows a perspective view of a component placement machine.
Figure 10:
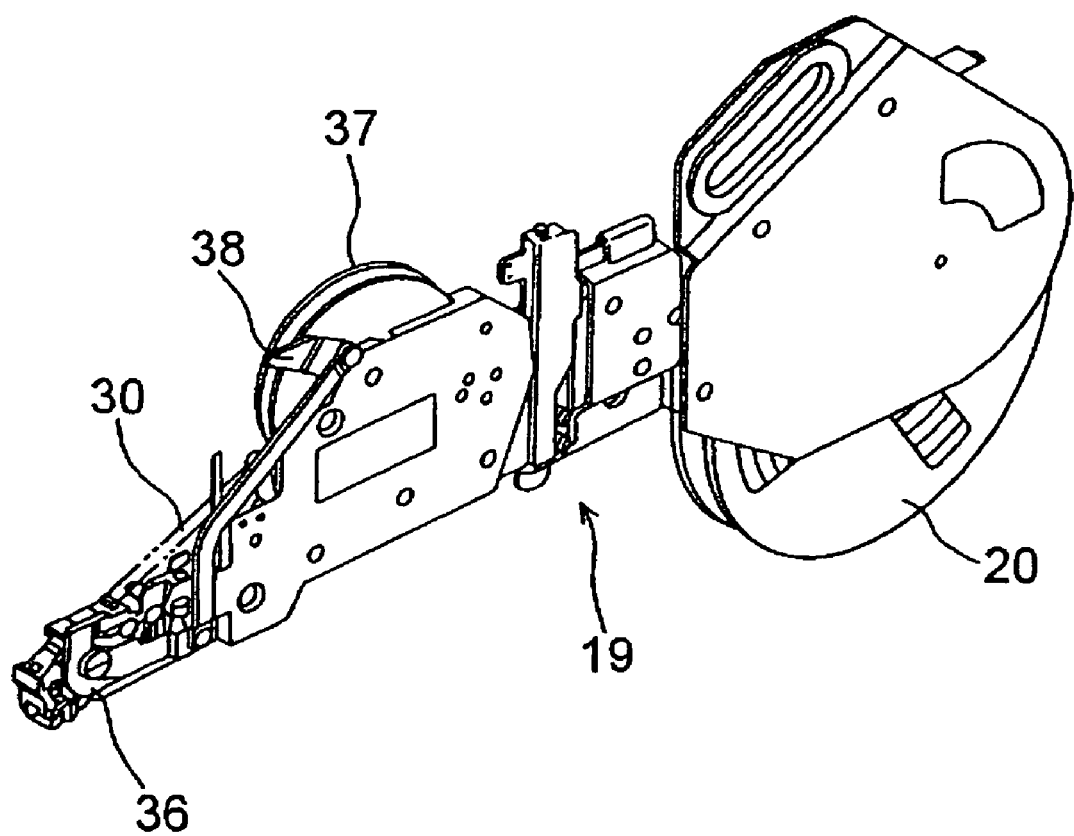
FIG. 10 shows a perspective view of a component supply cassette.
Figure 11:
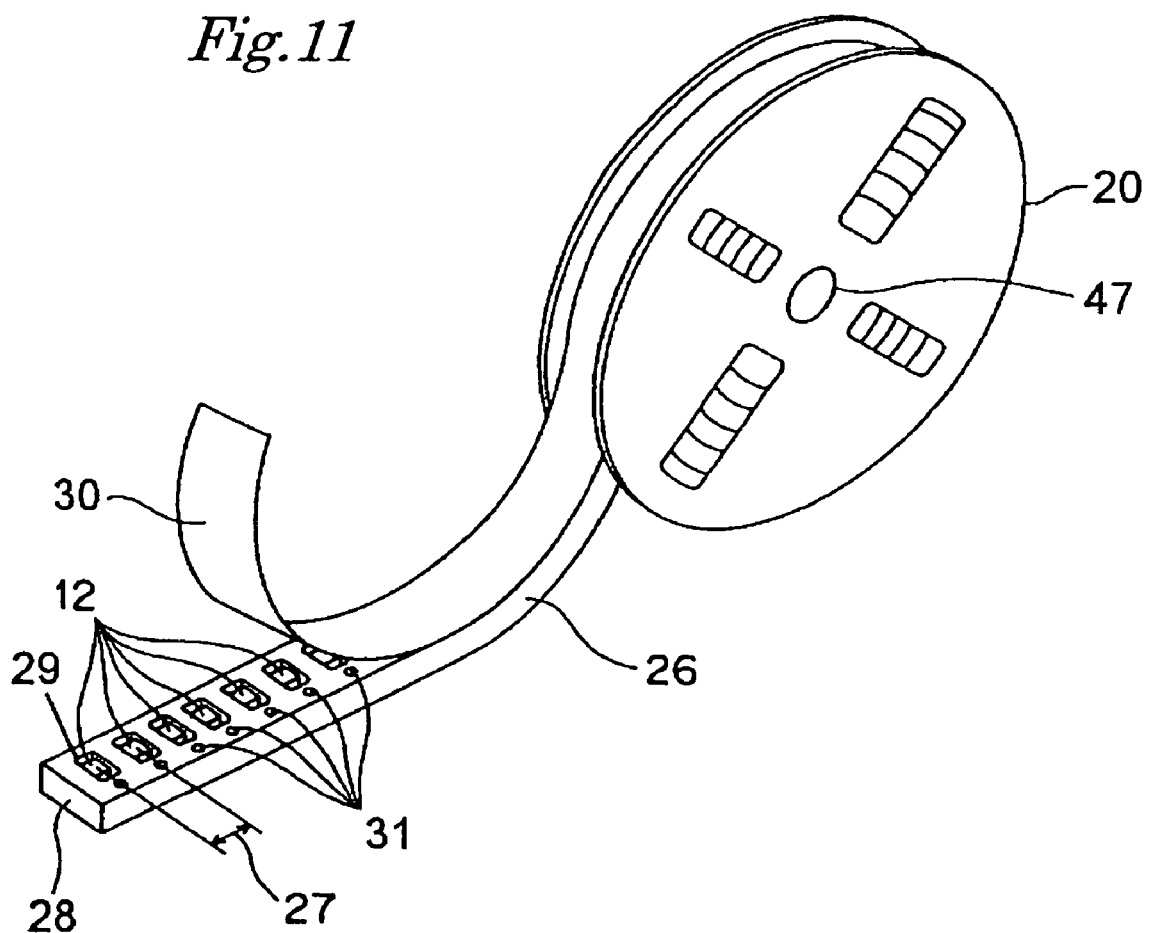
FIG. 11 shows a perspective view of a reel and a component carrier tape wound around the reel.
Figure 12:
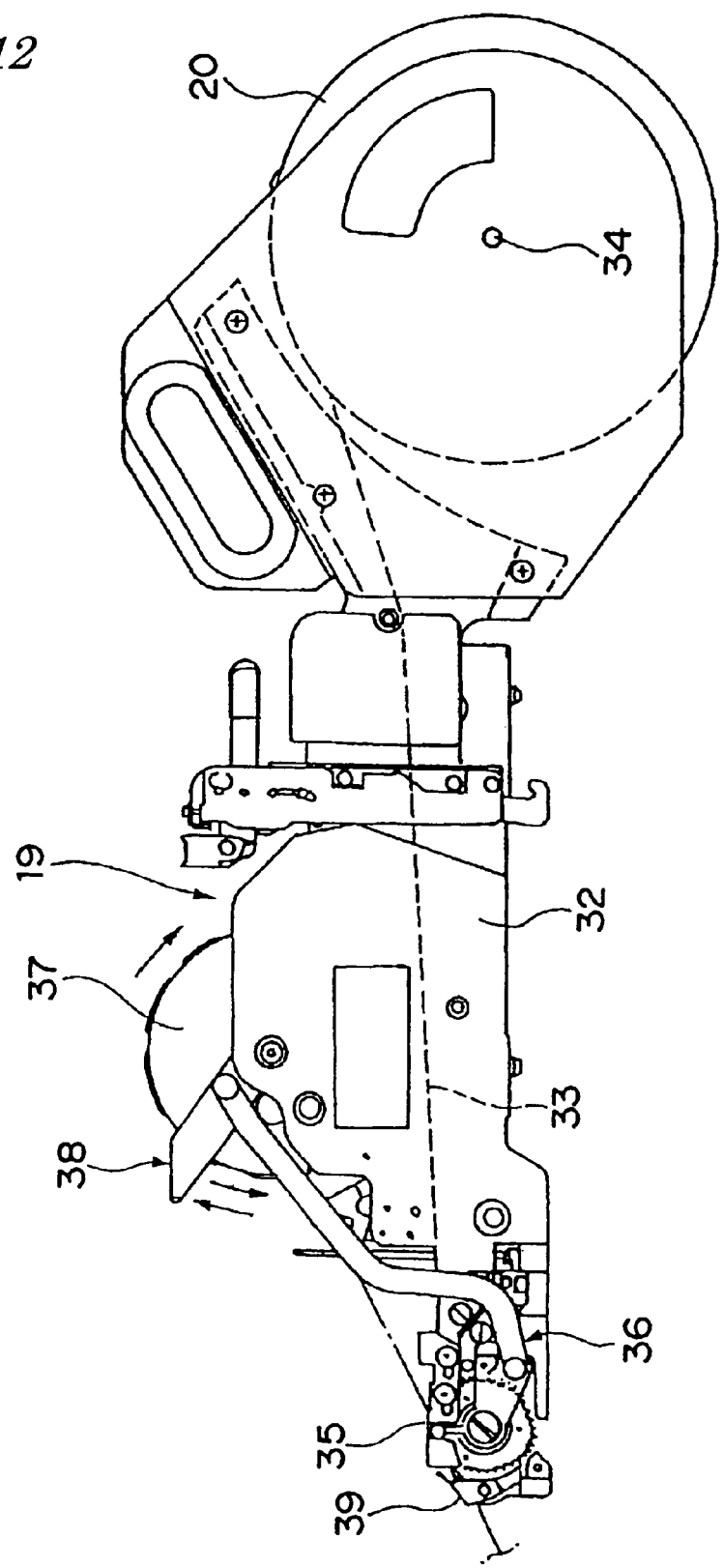
FIG. 12 shows a side view of a component supply cassette.
Figure 13A:
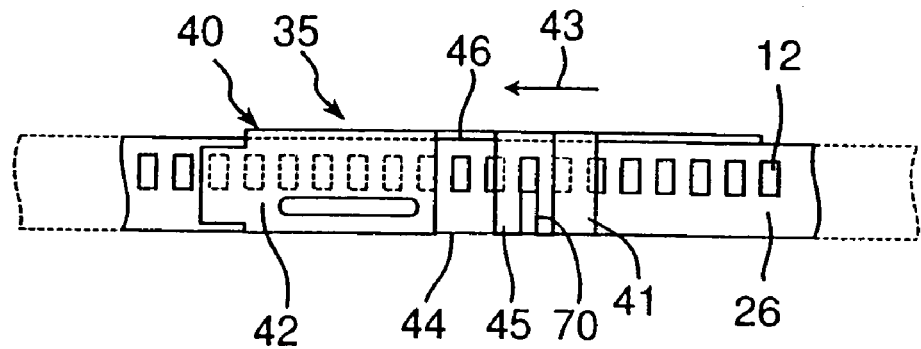
FIGS. 13A–13C show fragmental plan views of a component supply cassette illustrating its motion sequence.
Figure 13B:
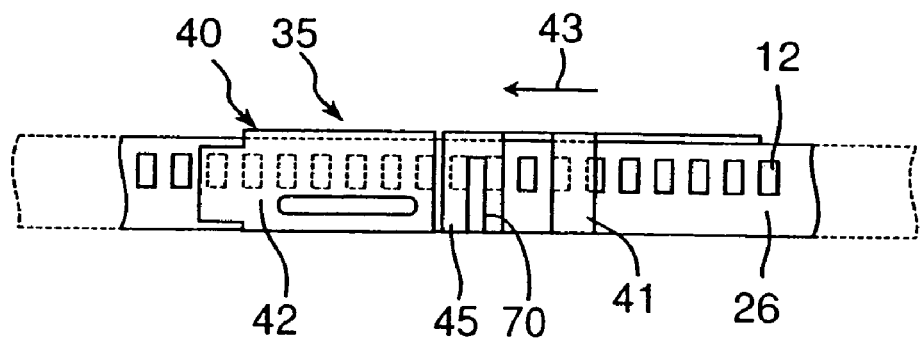
Figure 13C:
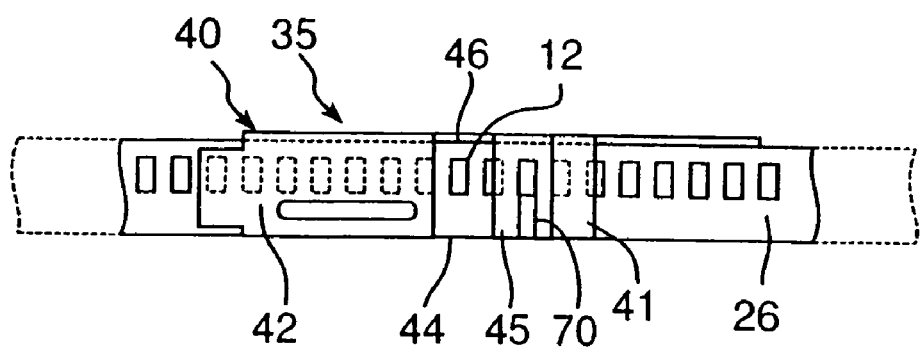
Figure 14A:
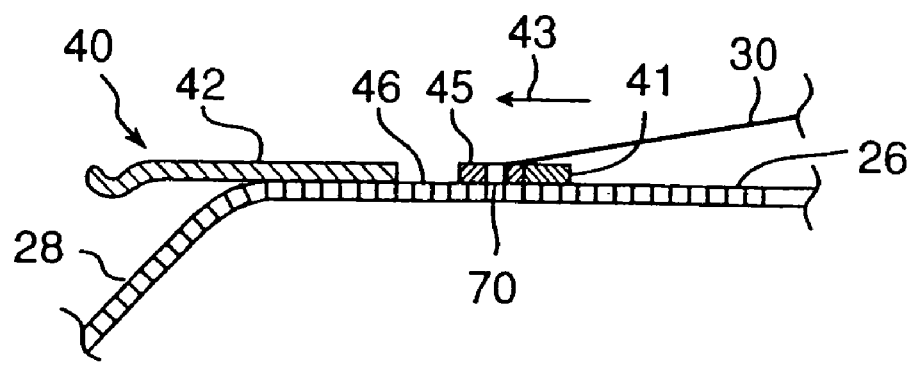
FIGS. 14A–14D shows motion sequence of the component supply cassette, similar to FIGS. 13A–13C.
Figure 14B:
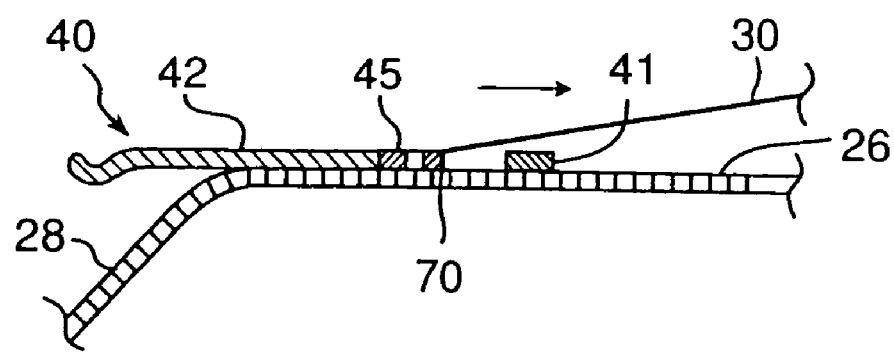
Figure 14C:
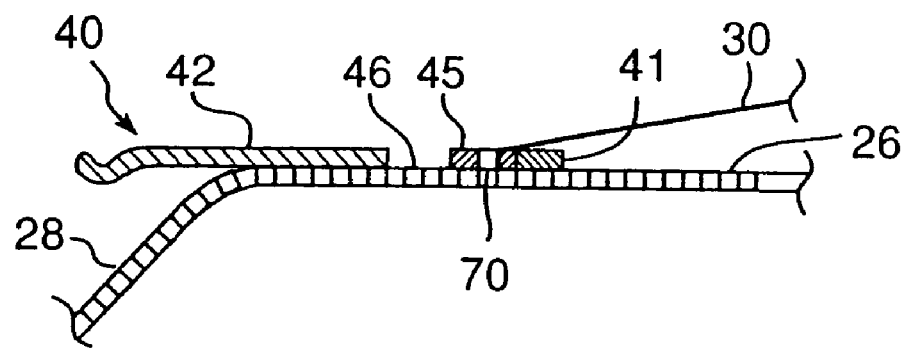
Figure 14D:
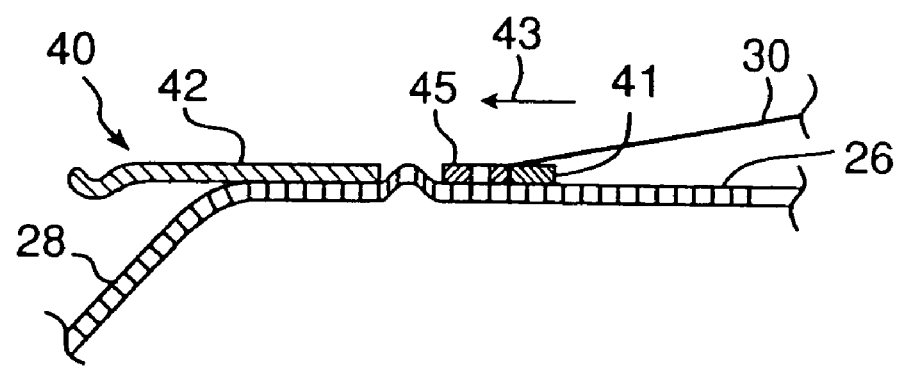
Figure 15:
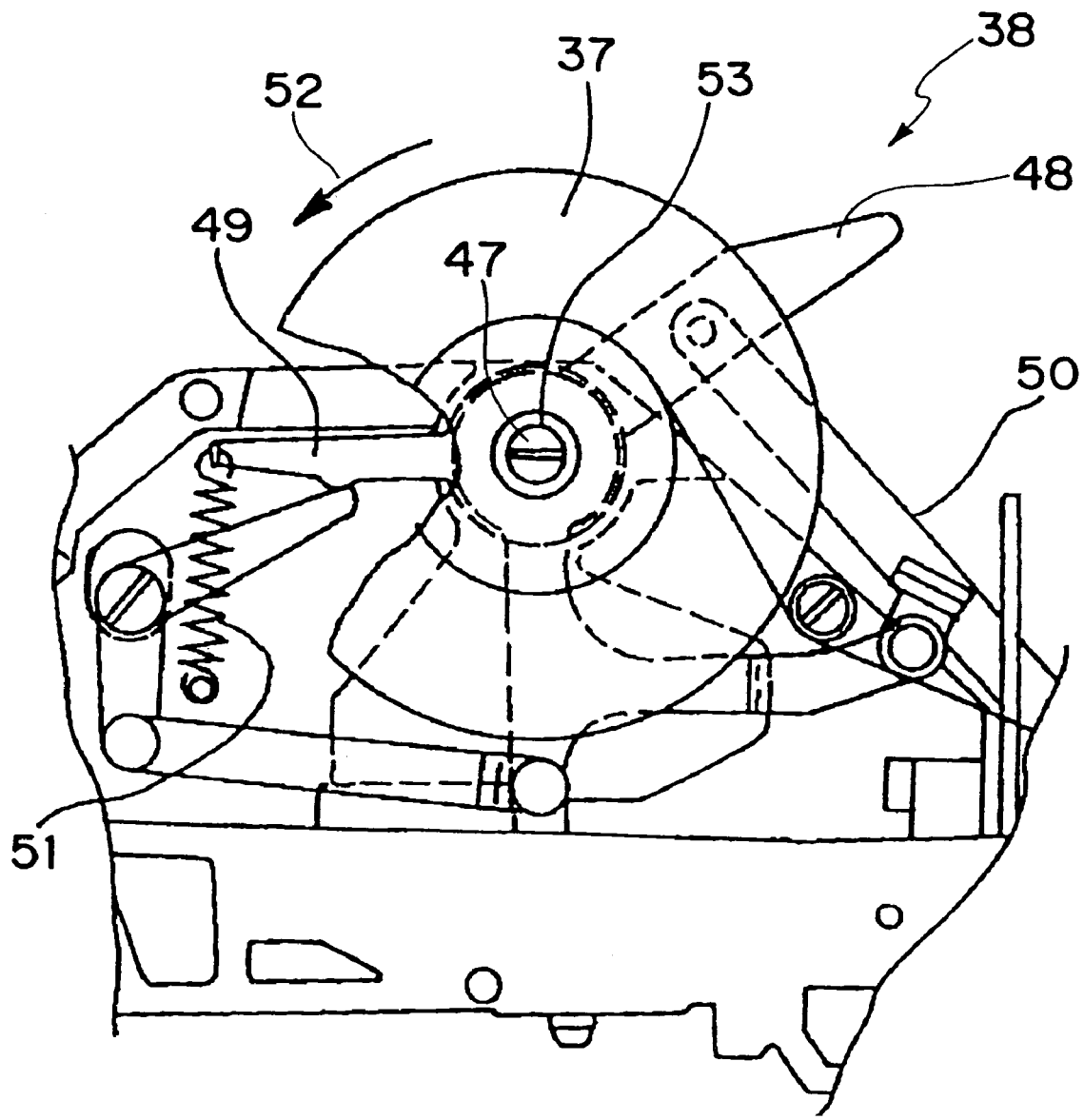
FIG. 15 shows an elevational side view of a portion of a component supply cassette.
Figure 16:
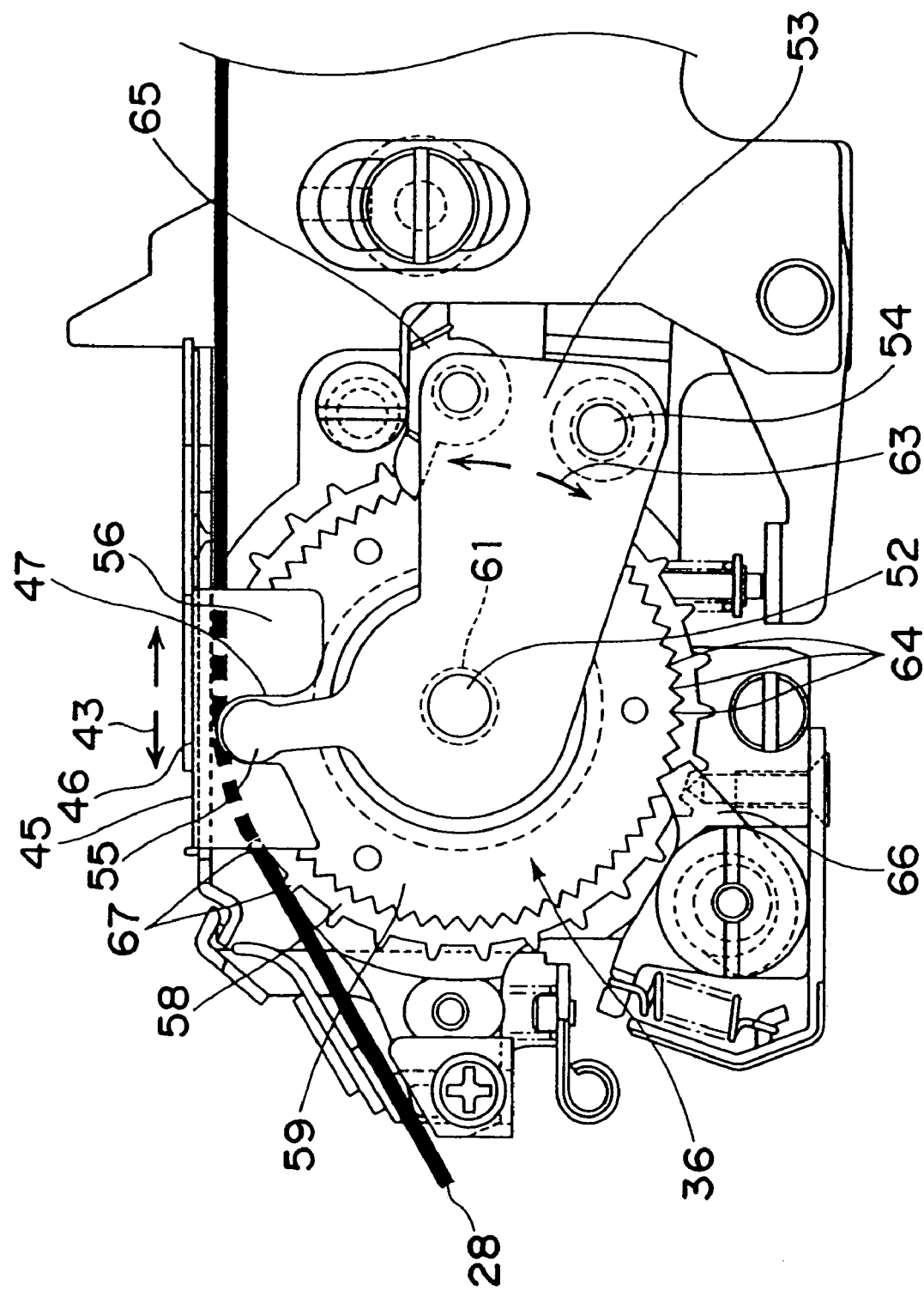
FIG. 16 shows an elevational side view of the other portion of the component supply cassette.
Figure 17:
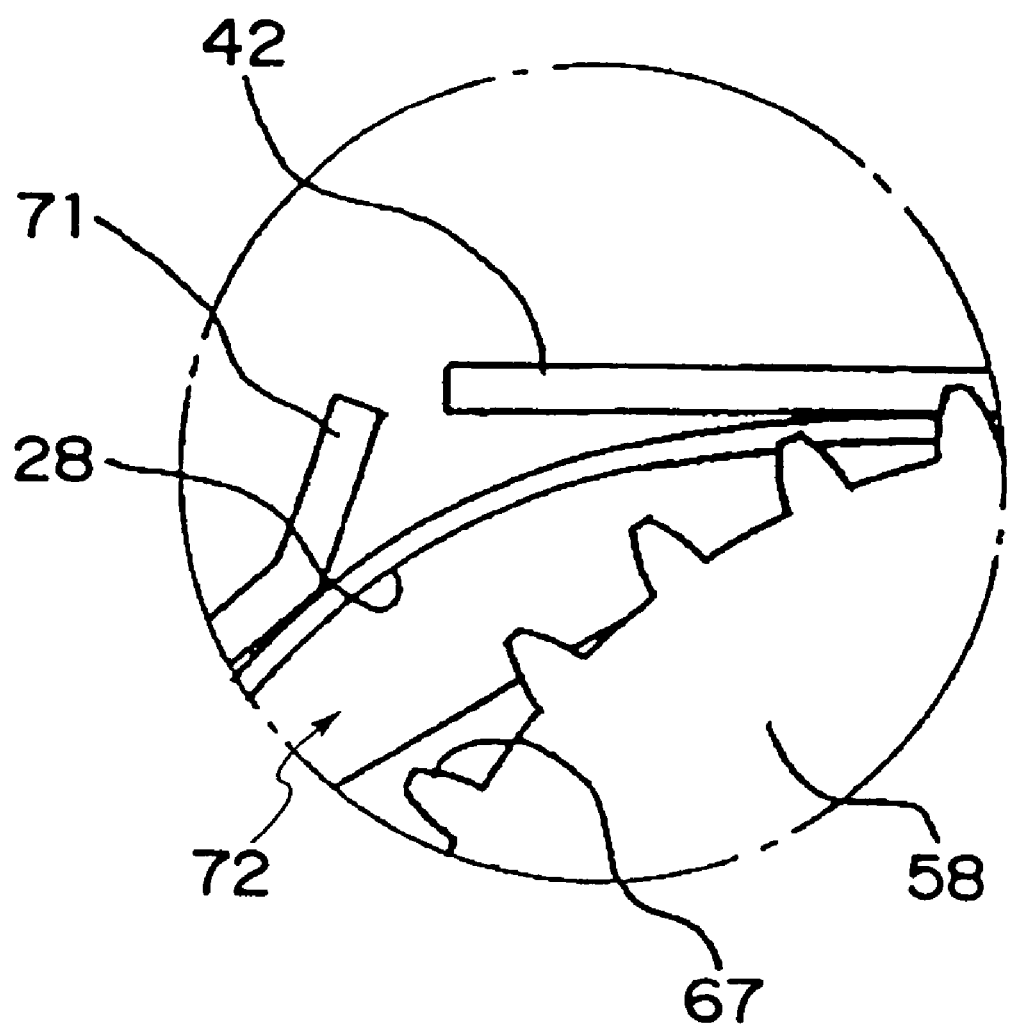
FIG. 17 shows a fragmental enlarged side view of the component supply cassette.
Figure 18:
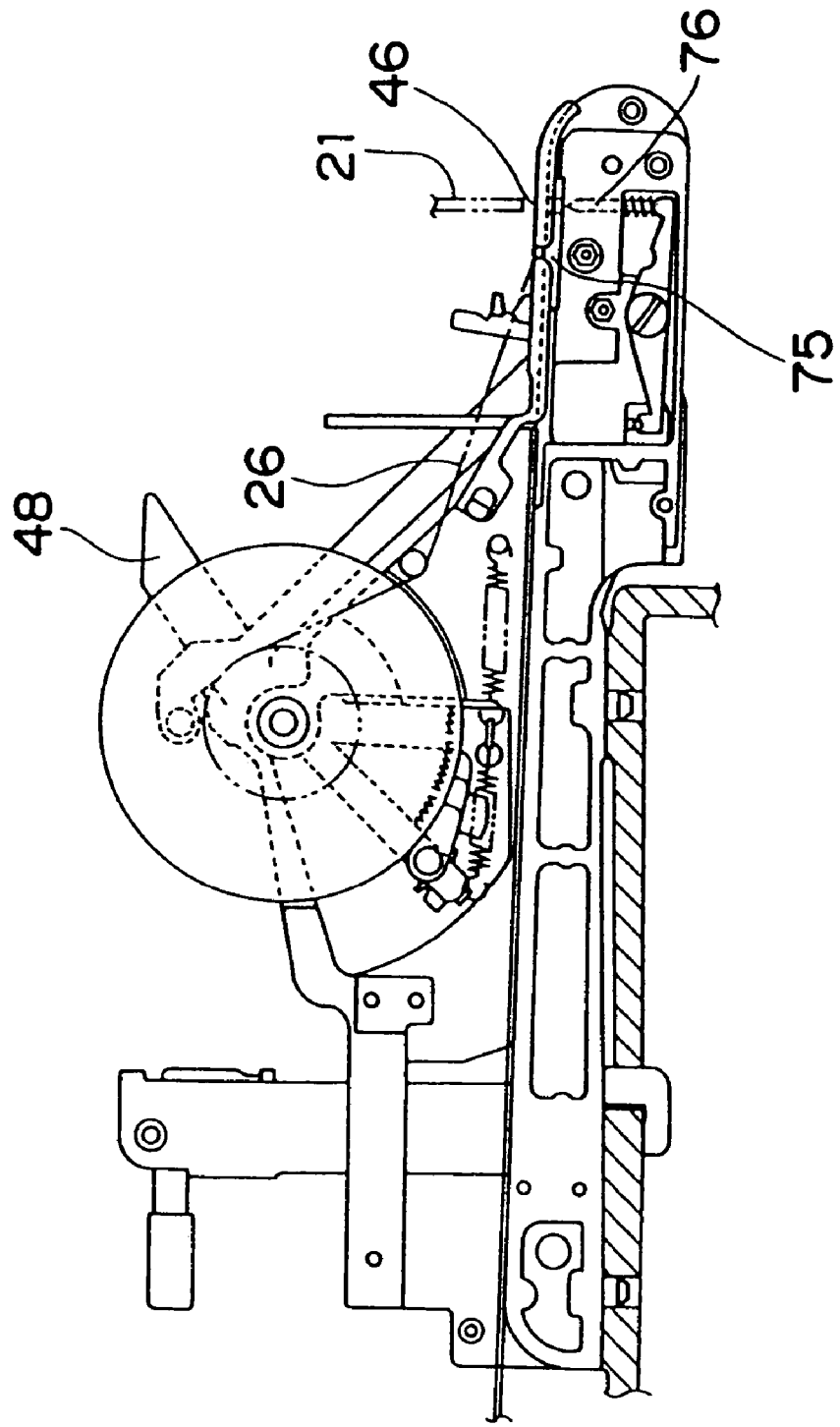
FIG. 18 shows an elevational side view of a different type of a component supply cassette.
Figure 19:
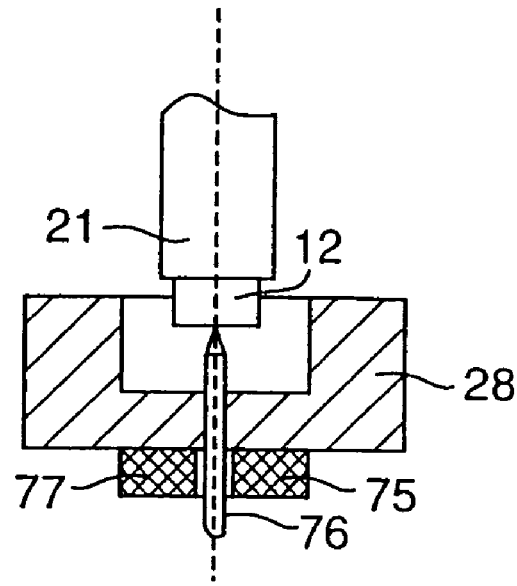
FIG. 19 shows a cross sectional view of a component supply cassette having a thrust pin.
Figure 20:
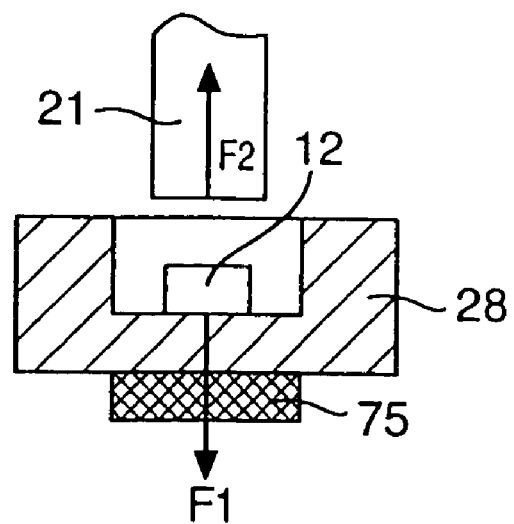
FIG. 20 shows a cross sectional side view of a component supply cassette having a permanent magnet.

FIG. 7 shows a portion of an apparatus for supplying a component carrier 140 according to the present embodiment. Referring to FIG. 7, the upper side guide 141 of the component supply cassette includes a support guide 143 extending therefrom, which extends toward the feed wheel 142 and faces thereto at the downstream side of the component pickup station (not shown in the drawing). A portion 144 of the support guide 143 has a slant periphery facing the feed wheel 142, which helps the perforations 145 formed on the base tape 127 to maintain their engagement with the teeth 146 of the feed wheel 142 even after passing the component pickup station.

According to the component supply 140 so constructed, stress or vibration of the base tape caused by stagnation or bending of the base tape is substantially eliminated or absorbed before it is transmitted to the component pickup station, since the base tape 127 may be retained by the feed wheel 142 for a relatively longer distance 147 after component pickup operation. As a result, the component located at the component pickup station may not bounce up inside the cavity, and hence the component may easily be picked up by the quill and held in a proper condition.

According to an experiment conducted by the inventors of the present invention, for the case of the conventional apparatus for supplying component carrier without having such a support guide 143, 4 components out of 1069 bounced up into a vertical position, while no such occurrences were observed in the case of the apparatus for supplying component carrier having the support guide of the present embodiment.

The configuration of the support guide 143 is not limited to the one herein illustrated, but rather the support guide can take any configuration so long as it can help the base tape to stay engaged with the feed wheel over a longer distance after passing the component pickup station.

Further, the support guide 143 may be formed as a block secured to the upper guide 141, or may be formed integrally as a portion of the upper guide 141 by changing its design.

What is claimed is:

1. An apparatus for supplying a component carrier in the form of a tape, said component carrier having a base tape in which a number of cavities are formed on one surface thereof for containing components and a top tape attached on said one surface of said base tape, said base tape further including a number of perforations defined therein at regular intervals wherein a certain length of said top tape is intermittently peeled off from said base tape so that one of said components is exposed at a pickup station where a pickup member reaches and picks up said exposed component, comprising:

a passage along which said component carrier is transported;

an electromagnetic device provided in said pickup station and adjacent to said base tape but away from said top tape;

a controller for controlling said electromagnetic device in such a manner that said electromagnetic device may attract and hold said component in position inside said cavity;

a rotatable wheel having a number of teeth formed around a periphery thereof for engagement with said perforations in said pickup station so as to transport said base tape through rotation of said wheel;

a guide member provided adjacent to said pickup station for ensuring said engagement between said perforations and said teeth; and a support guide provided adjacent to the periphery of said wheel and in a region where a portion of said base tape is about to disengage from said teeth, said support guide being formed as a block secured to the guide member and structured to increase a length of an engaged portion formed by said perforations and said base tape.

2. The apparatus in accordance with claim 1, wherein said controller turns on said electromagnetic device immediately before said intermittent transporting of said component carrier and turned it off immediately after said intermittent transporting of said component carrier.

3. The apparatus in accordance with claim 1, wherein said controller turns off said electromagnetic device immediately before an pickup operation of said pickup member and turns it on immediately after completion of said pickup operation.

4. The apparatus in accordance with claim 1, wherein said support guide includes a slanted surface that opposes the rotatable wheel.

5. An apparatus for supplying a component carrier in the form of a tape, said component carrier having a base tape in which a number of cavities are formed on one surface thereof for containing components and a top tape attached on said one surface of said base tape, said base tape further including a number of perforations defined therein at regular intervals, wherein a certain length of said top tape is peeled off from said base tape at a peeling station to expose one of said components and then said exposed component is picked up from said cavity at a pickup station, comprising:

a passage along which said component carrier is transported;

a first electromagnetic device provided in said pickup station for attracting said component in position within said cavity;

a second electromagnetic device provided in said peeling station for attracting said component in position within said cavity;

a controller for controlling said first and second electromagnetic devices in such a manner that said first electromagnetic device is turned off before a pickup operation of said component and turned on after said pickup operation, and that said second electromagnetic device is turned on before a peeling operation of said top tape and turned off after said peeling operation;

a rotatable wheel having a number of teeth formed around a periphery thereof for engagement with said perforations in said pickup station so as to transport said base tape through rotation of said wheel;

a guide member provided adjacent to said pickup station for ensuring said engagement between said perforations and said teeth; and a support guide provided adjacent to the periphery of said wheel and in a region where a portion of said base tape is about to disengage from said teeth, said support guide being formed as a block that is secured to said guide member and extends toward the base tape to a position intermediate the top of the teeth and the base of the teeth, said block being structured to increase a length of said base tape that is engaged by the rotatable wheel.

6. The apparatus in accordance with claim 5, wherein said support guide includes a slanted surface that faces the rotatable wheel.

* * * * *